(12) United States Patent
Howell et al.

(10) Patent No.: US 7,075,209 B2
(45) Date of Patent: Jul. 11, 2006

(54) COMPLIANT BISTABLE MICROMECHANISM

(75) Inventors: Larry L. Howell, Orem, UT (US); Matthew Parkinson, Ann Arbor, MI (US); Brian D. Jensen, Ann Arbor, MI (US); Gregory M. Roach, Springville, UT (US)

(73) Assignee: Brigham Young University, Provo, UT (US)

( * ) Notice: Subject to any disclaimer, the term of this patent is extended or adjusted under 35 U.S.C. 154(b) by 0 days.

(21) Appl. No.: 10/333,302

(22) PCT Filed: Jul. 18, 2001

(86) PCT No.: PCT/US01/22661

§ 371 (c)(1),
(2), (4) Date: Jan. 17, 2003

(87) PCT Pub. No.: WO02/07300

PCT Pub. Date: Jan. 24, 2002

(65) Prior Publication Data

US 2004/0020968 A1   Feb. 5, 2004

Related U.S. Application Data

(60) Provisional application No. 60/218,843, filed on Jul. 18, 2000.

(51) Int. Cl.
  *H02N 1/00* (2006.01)
  *G01P 15/02* (2006.01)
(52) U.S. Cl. .................. 310/309; 200/181; 73/514.01; 73/514.21; 73/514.32
(58) Field of Classification Search ................ 310/306, 310/307, 309; 257/415, 420; 200/181; 60/516, 60/527; 73/514.01, 514.21, 514.32
See application file for complete search history.

(56) References Cited

U.S. PATENT DOCUMENTS

| | | | |
|---|---|---|---|
| 2,931,954 A | 4/1960 | Diesel | 361/207 |
| 5,375,033 A | 12/1994 | MacDonald | 361/281 |
| 5,677,823 A | 10/1997 | Smith | 361/234 |
| 5,998,906 A | 12/1999 | Jerman et al. | 310/309 |
| 6,019,113 A | 2/2000 | Allston et al. | 137/1 |
| 6,215,081 B1 | 4/2001 | Jensen et al. | 200/341 |
| 6,236,300 B1 | 5/2001 | Minners | 337/139 |
| 6,239,685 B1 | 5/2001 | Albrecht et al. | 337/365 |
| 6,255,757 B1 | 7/2001 | Dhuler et al. | 310/307 |
| 6,303,885 B1 | 10/2001 | Hichwa et al. | 200/181 |
| 2003/0029705 A1 | 2/2003 | Qiu et al. | 200/181 |

*Primary Examiner*—Karl Tamai
(74) *Attorney, Agent, or Firm*—Madson & Austin

(57) ABSTRACT

A method for designing and optimnizing compliant mechanisms is provided, in addition to bistable compliant mechanism designs. According to the method, a selected compliant structure may be modeled analytically, and the characteristics of the analytical model may be optimized. Multiple recursive optimization algorithms may be used, for example, to determine the general location of a global optimum, and then to determine the values of the analytical model characteristics that obtain the global optimum or a feasible configuration for the selected compliant structure. Geometric characteristics of the selected compliant structure may be derived from the values of the analytical model characteristics. Bistable compliant designs may have a shuttle disposed between a pair of base members. The shuttle (20) may be linked to the base members (22, 24) by a pair of legs (30, 32), via flexural pivots. The base members may have cantilevered mounting beams to create deformable mounts that receive and store potential energy. The stable configurations are those in which the stored potential energy is at a relative minimum.

67 Claims, 10 Drawing Sheets

COMPLIANT BISTABLE MICROMECHANISM

CROSS-REFERENCE TO RELATED APPLICATIONS

This application is the National Stage of International Application PCT/US01/22661, filed Jul. 18, 2001, which claims the benefit of U.S. Provisional Application 60/218,843, filed Jul. 18, 2000.

FIELD OF THE INVENTION

The present method and apparatus relates to compliant mechanisms. More particularly, the invention relates to a method for designing and optimizing compliant mechanisms in general, and the invention also relates to compliant bistable mechanisms.

TECHNICAL BACKGROUND

The term "compliant mechanisms" relates to a family of devices in which integrally formed flexural members provide motion through deflection. Such flexural members may therefore be used to replace conventional multi-part elements such as pin joints. Compliant mechanisms provide several benefits, including backlash-free, wear-free, and friction-free operation. Moreover, compliant mechanisms significantly reduce manufacturing time and cost. Compliant mechanisms can replace many conventional devices to improve functional characteristics and decrease manufacturing costs. Assembly may, in some cases, be obviated entirely because compliant structures often consist of a single piece of material.

In microelectromechanical systems (MEMS), compliant technology allows each mechanism of a MEMS system to be an integrally formed, single piece mechanism. Because MEMS devices are typically made by a layering and etching process, elements in different layers must normally be etched and formed separately from each other. Additionally, elements with complex shapes, such as pin joints, require multiple steps and layers to create the pin, the head, the pin-mounting joint, and the gap between the pin and the surrounding ring used to form the joint. The gap between the pin and the surrounding ring causes the joint to be loose, which results in imprecise movements and backlash.

An integrally formed compliant mechanism, on the other hand, may be constructed as a single piece, and may even be constructed in unitary fashion with other elements of the micromechanism. Substantially all elements of many compliant devices may be made from a single layer. Reducing the number of layers, in many cases, simplifies the manufacturing and design of MEMS devices. Compliant technology also has unique advantages in MEMS applications because compliant mechanisms can be manufactured unitarily, i.e., from a single continuous piece of material, using masking and etching procedures similar to those used to form semiconductors.

In MEMS as well as in other applications, there exists a large need for "bistable devices," or devices that can be selectively disposed in either of two different, stable configurations. Bistable devices can be used in a number of different mechanisms, including switches, valves, clasps, and closures. Switches, for example, often have two separate states: on and off. However, most conventional switches are constructed of rigid elements that are connected by hinges, and therefore do not obtain the benefits of compliant technology. Compliant bistable mechanisms have particular utility in a MEMS environment, in which electrical and/or mechanical switching at a microscopic level is desirable, and in which conventional methods used to assemble rigid body structures are ineffective.

Unfortunately, compliant mechanisms nearly always involve large deflection of at least one member; consequently, traditional deflection equations simply are either too inaccurate, due to small deflection assumptions, or are too complex to use efficiently in design. To the extent that mathematical relationships exist for large deflection analysis, these mathematical relationships involve very complex mathematical functions, such as elliptical integrals, for which there is often no closed form solution. Thus, the process of designing any compliant mechanism can be rather difficult.

Bistable mechanisms present a unique challenge because the compliant elements must be properly balanced so that two fully stable positions exist. Even if a bistable design is obtained by fortunate guesswork or extensive testing, conventional optimization techniques are often ineffective because the design space is so complex, i.e., highly nonlinear and discontinuous, with such a small feasible space that gradient-driven methods are unable to reach a workable solution. The likelihood that a stochastic method will stumble onto a solution is extremely small. Consequently, known techniques have a level of noise that is too large to permit the efficient and accurate optimization. Hence, it is difficult to enhance the bistable design, except through additional experimentation.

Consequently, it would be an advancement in the art to provide a bistable compliant mechanism, and particularly a bistable compliant mechanism that could be produced on a microscopic scale for use in MEMS applications. Furthermore, it would be an advancement in the art to provide a system and method whereby compliant mechanisms in general could be designed and optimized to obtain a variety of objective characteristics such as bistable operation, minimum input force, and the like.

BRIEF SUMMARY OF THE INVENTION

The present invention provides a method whereby compliant mechanisms can be designed and optimized. According to one embodiment, a compliant "topology," or a compliant structure, is first selected. The selected compliant structure has geometric characteristics that are to be determined in order to obtain an objective characteristic related to the performance of the compliant structure. An analytical model of the selected compliant structure may then be created. The analytical model may be a pseudo-rigid body model, in which flexible segments are modeled as rigid links connected by rigid joints and springs, a finite element model, a collection of closed form equations, or any combination of the three. Analytical model characteristics that correspond to the geometric characteristics of the selected compliant structure may then be used to conduct further analysis.

Using the analytical model, mathematical relationships may be determined between the analytical model characteristics and the objective characteristic. These mathematical relationships may be utilized in a recursive optimization algorithm. Other methods, such as finite element analysis, may also be used in the place of closed form equations. Thus, a first recursive optimization algorithm may be applied to obtain first values of the analytical model characteristics; the first values may be the values that approach a global optimum for the objective characteristic. Consequently, the first recursive optimization algorithm may beneficially be an algorithm designed to avoid less preferable local optima in favor of a global optimum. Simulated annealing is one example of such a recursive optimization algorithm.

After the first set of values of the analytical model characteristics has been obtained, a second recursive optimization algorithm may be applied to obtain a second set of values of the analytical model characteristics. The second set of values provides a value of the objective characteristic that lies within a threshold of the global optimum. The second recursive optimization algorithm may thus be an algorithm that is designed to accurately and rapidly approach the nearest optimal value. The generalized reduced gradient method is one example of a method that may be used for the second recursive optimization algorithm.

Once the second set of values for the analytical model characteristics has been obtained, the desired values of the geometric characteristics may be derived from the second set of values, and through known relationships between the geometric characteristics and the analytical model characteristics. Once the desired values for the geometric characteristics have been obtained, they may simply be applied to the selected compliant structure to complete the optimization process.

Bistable compliant mechanisms according to the invention may be designed and/or optimized with such a process, or may be designed using other methods. The bistable compliant mechanisms have two low potential energy configurations, or stable configurations. According to one embodiment, a bistable compliant mechanism may have a shuttle positioned between two base members. The shuttle may have two stable positions, each of which corresponds to one of the configurations. The shuttle may be attached to the base members via a pair of semi-rigid legs, which are attached to the shuttle and the base members via pivotal couplings, which may take the form of small-length flexural pivots, or flexural pivots.

The base members may have mounting beams affixed in a dual-cantilevered manner; the mounting beams, in conjunction with the base members, may form deformable mounts to which the legs are attached via the flexural pivots. When an input force is applied against the shuttle, the force is transmitted through the legs to press outward against the deformable mounts. The deformable mounts, in turn, apply force inward against the legs, tending to move the legs back into an angled configuration. If further input force is applied against the shuttle, the mechanism may reach a toggle point, where the shuttle is in an unstable equilibrium. Once the shuttle passes the toggle point, the potential energy stored by the deformable mounts urges the mechanism into the second stable configuration.

Numerous other embodiments may be created through varying parameters of the mechanism. For example, only a single leg may be used, and the shuttle may be disposed against a surface against which it is able to slide. Alternatively, additional leg sets may be added to provide additional stability. The deformable mounts may be reconfigured to use fixed-free beams or other structures capable of storing energy.

Such bistable mechanisms may be actuated in a variety of ways. Actuators such as rigid mechanical elements, electrostatic actuators, thermal expansion actuators, and the like may be used. Such actuators may be positioned near the shuttle to push the shuttle into the second stable configuration. In the alternative, such actuators may be attached to or unitarily formed with the shuttle to provide pushing or pulling capability. According to still other embodiments, the bistable mechanism itself may receive an electric current to initiate motion of the mechanism between the stable configurations.

DETAILED DESCRIPTION OF THE INVENTION

The present apparatus and method will be best understood by reference to the drawings, wherein like parts and steps are designated by like numerals throughout. It will be readily understood that the components of the present mechanism, as generally described and illustrated in the Figures herein, could be arranged and designed in a wide variety of different configurations. Thus, the following detailed description of the embodiments of the apparatus and method, as represented in the Figures, are not intended to limit the scope of the claim, but are merely representative of present embodiments of the apparatus and method.

Figure 1:
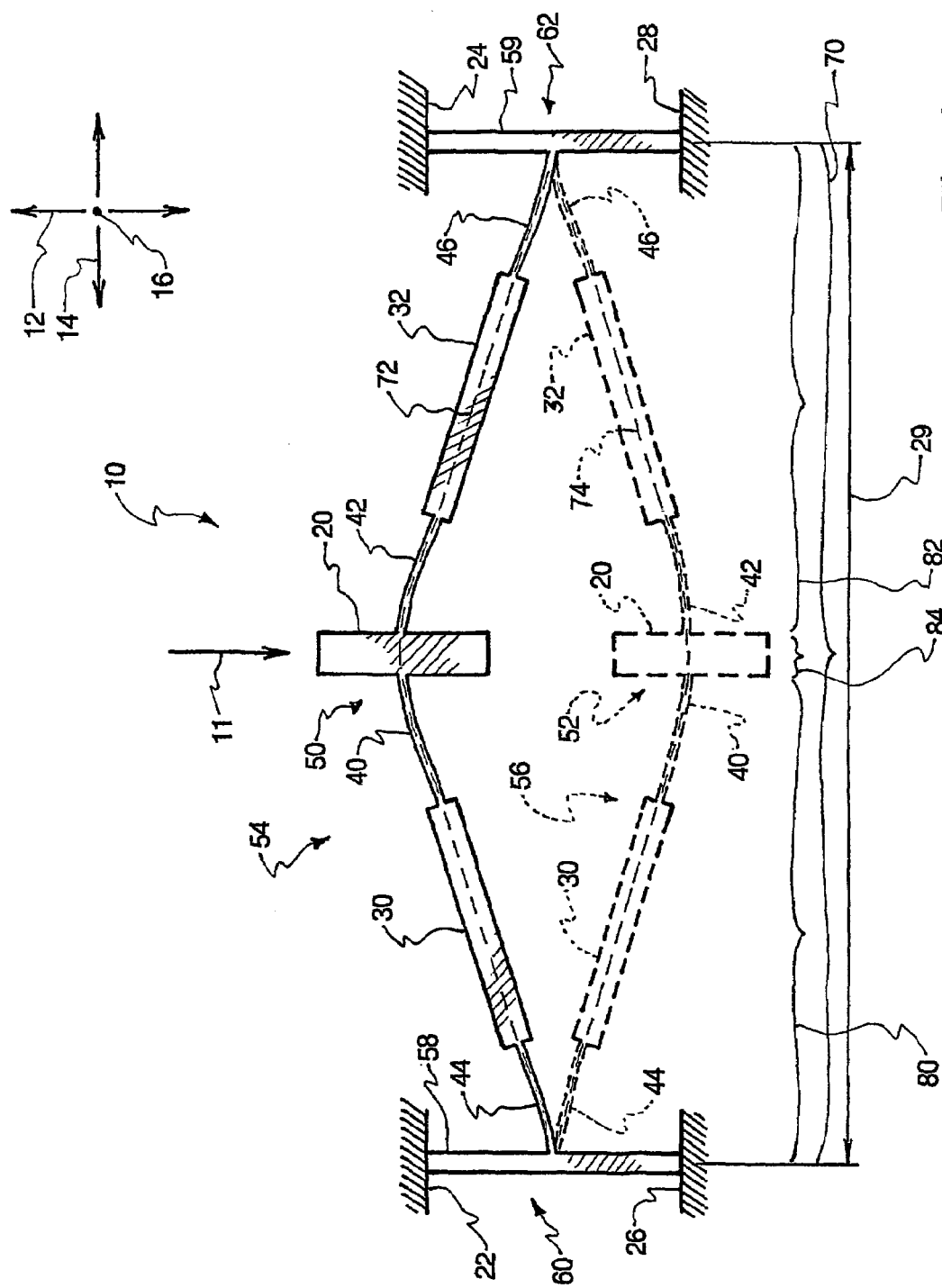
FIG. 1 is a plan view of one embodiment of a compliant bistable mechanism according to the invention.

Referring to FIG. 1, one example of an integrally formed compliant mechanism 10, or mechanism 10, is shown. The mechanism 10 may be sized for MEMS applications. Although many of the examples presented herein apply to MEMS applications, the apparatus and method of the present invention are not limited to MEMS, but are rather applicable to compliant mechanisms in general.

The exemplary mechanism 10 of FIG. 1 is a bistable micromechanism, or a MEMS device that can be actuated between two stable configurations through the application of an input force 11. Such a mechanism may be used to perform microswitching functions or the like. The mechanism 10 may have a longitudinal direction 12, a lateral direction 14, and a transverse direction 16. The mechanism 10 may have a substantially planar configuration, e.g., all parts of the mechanism 10 may have substantially the same thickness and positioning in the transverse direction 16. The mechanism 10 may have a shuttle 20 configured to receive the input force 11 and, if desired, exert an output force on some other object.

The shuttle 20 may be connected to a first base member 22, a second base member 24, a third base member 26, and a fourth base member 28. The base members 22, 24, 26, 28 may be stationary, or may be affixed to other stationary or mobile MEMS devices. Consequently, the base members 22, 24, 26, 28 are depicted simply as attachment surfaces. The first and third base members 22, 26 may be separated from the second and fourth base members 24, 28 by an offset distance 29. The offset distance 29 may be substantially fixed. The shuttle 20 may be connected to the base members 22, 24, 26, 28 through the use of a first leg 30 and a second leg 32. The legs 30, 32 may be thick enough to be substantially-rigid. The exemplary mechanism 10 of FIG. 1 implements two general types of compliant segments, or segments that are designed to provide motion and/or biasing force through deformation.

More specifically, the mechanism 10 may have a first shuttle pivot coupling 40 and a second shuttle pivot coupling 42 that pivotally attach the shuttle 20 to the first and second legs 30, 32. Similarly, the mechanism may have a first base pivot coupling 44 and a second base pivot coupling 46 that pivotally attach the first and second legs 30, 32 with the base members 22, 24, 26, 28. As shown, the pivot couplings 40, 42, 44, 46 take the form of small-length flexural pivots 40, 42, 44, 46, or flexural pivots 40, 42, 44, 46; however, in other embodiments, pin joints or other types of compliant members may be used. The flexural pivots 40, 42, 44, 46 allow the shuttle 20 to travel from a first position 50 to a second position 52 by flexing to provide pivotal motion similar to that of a pin joint. Thus, the mechanism 10 has a first stable configuration 54, or first configuration 54 corresponding to the first position 50 and a second stable configuration 56, or second configuration 56 corresponding to the second position 52.

Generally, small-length flexural pivots are thin cross-sectioned segments that replace traditional pivotal joints while still allowing the joint to be mathematically modeled as a traditional pivotal joint. Small-length flexural pivots bend along their length to allow other elements of a micro-mechanism to move relative to each other. Small-length flexural pivots can have a wide variety of lengths and shapes to suit multiple designs. Longer small-length flexural pivots allow for a large range of motion, while shorter pivots are easier to model with techniques, such as pseudo-rigid body modeling.

To facilitate mathematical modeling of the small-length flexural pivots through methods such as pseudo-rigid body modeling, it is advantageous to form each of the flexural pivots 40, 42, 44, 46 with a length of less than 10% of the length of the legs 30, 32 to which they are attached. However, the length of the flexural pivots 40, 42, 44, 46 must also be sufficiently long to allow the legs 30, 32 to rotate through the necessary angle as the shuttle 20 travels between the first and second positions 50, 52. Therefore, depending on the desired displacement between the first and second positions 50, 52 of the shuttle 20, a 10% ratio of flexural pivot length to leg length may be advantageous. Longer flexural pivots 40, 42, 44, 46 may also be used, but may require the use of more advanced modeling techniques.

The first and third base members 22, 26 may be connected together by a first mounting beam 58, and the second and fourth base members 24, 28 may be connected together to form a second mounting beam 59. The mounting beams 58, 59 may have a length and thickness selected to permit bending in the fixed-fixed configuration. Thus, the first and third base members 22, 26 may operate in conjunction with the first mounting beam 58 to form a first deformable mount 60, and the second and fourth base members 24, 28 may similarly operate in conjunction with the second mounting beam 59 to form a second deformable mount 62. The first and second deformable mounts 54, 56 may be coupled to the legs 30, 32 by the first and second base flexural pivots 44, 46, respectively. The deformable mounts 60, 62 may function similar to springs, in that they elastically deflect when the legs 30, 32 press outward against them.

The motion of the elements of a compliant mechanism is determined by the geometry of the elements. Thin or necked-down members, such as the deformable mounts 60, 62 and the flexural pivots 40, 42, 44, 46, will flex as they receive a load sufficient to cause a deformation or a deflection. Conversely, thick members, such as the legs 30, 32 and the shuttle 20, will remain substantially undeflected under loading of the mechanism 10. Typically, some minor bending will occur in thicker members such as the legs 30, 32 and the shuttle 20; however, such bending is small in comparison to the deflections of the thinner members. The combination of the flexural pivots 40, 42, 44, 46 and deformable mounts 60, 62 with the legs 30, 32 provides the range of motion necessary for the mechanism 10 of FIG. 1 to move between the first configuration 54 and the second configuration 56.

The deformable mounts 60, 62 may be undeflected, or only slightly deflected, when the shuttle 20 is in the first position 50 or the second position 52 so that the first and second configurations 54, 56 are both low potential energy states. However, when the shuttle 20 is disposed between or outside the first and second positions 50, 52, the deformable mounts 60, 62 may be deformed to a larger extent to store a larger amount of potential energy, and thereby provide the impetus for the mechanism 10 to rectum to the first configuration 54 or the second configuration 56.

Thus, the mechanism 10 obtains its stability in two configurations from the existence of two low potential energy positions. A mechanism implementing low potential energy positions provides better control and a larger range of design possibilities than do bistable mechanisms implementing residual stress or buckled beamed methods. The mechanism 10 of FIG. 1 uses a combination of the flexural pivots 40, 42, 44, 46, the deformable mounts 60, 62, and the legs 30, 32 to create at least two low potential energy positions.

When the shuttle 20 is disposed between the first and second positions 50, 52, the deformable mounts 60, 62 may be bent outward. When the shuttle 20 is disposed outward of the first position 50 or the second position 52, the deformable mounts 60, 62 may be bent inward. Deformable mounts need not be configured in the same manner as the deformable mounts 60, 62 of FIG. 1, but may involve the use of fixed-free cantilever mounting beams, zigzagging flexural segments, or the like, as will be shown and described hereafter.

The mechanism 10 may also be described as a compliant bridge 70 coupled to and integrally formed with the base members. 22, 24, 26, 28. The bracket labeled 70 indicates that, in the mechanism 10 of FIG. 1, the compliant bridge 70 includes the shuttle 20, the flexural pivots 40, 42, 44, 46, and the legs 30, 32.

The compliant bridge 70 may be selectively disposable along a first path 72, which corresponds to the first position 50 and the first configuration 54, and a second path 74, which corresponds to the second position 52 and the second configuration 56. The paths 72, 74 may each be longer than the offset distance 29, so that the compliant bridge 70 is curved or kinked in each of the first and second configurations 54, 56. Conversion between the first and second configurations 54, 56 may simply entail reversing the curvature or kinking of the compliant bridge 70.

The compliant bridge 70 is curved or kinked in both configurations 54, 56 because the tendency of the deformable mounts 60, 62 to stay straight is of a higher magnitude than the tendency for the compliant bridge 70 to return to its original state. For example, the mechanism 10 may be manufactured in the first configuration 54, so that there is substantially no deformation of the mechanism 10 in the first configuration 54. Thus, in the second configuration 56, the compliant bridge 70 may be generally bent in a direction opposite to its original, undeflected curvature. The compliant bridge 70 may thus exert outward force against the deformable mounts 60, 62 in the second configuration 56 due to its tendency to return to its undeflected state. The deformable mounts 60, 62 must therefore provide a resilient force sufficient to counteract the outward pressure of the compliant bridge 70 in the second configuration 56, so that the compliant bridge 70 will remain deflected in the absence of any external force.

Such tendencies or strengths are a function of the geometry and positioning of the elements of the mechanism 10. In FIG. 1, the deformable mounts 60, 62 have a thicker width than the flexural pivots 40, 42, 44, 46, so that the deformable mounts 60, 62 have a comparatively strong tendency to remain straight. The resilient forces produced by the deformable mounts 60, 62 and the flexural pivots 40, 42, 44, 46 can be compared to springs with different spring constants. Thicker elements are analogous to springs with large spring constants, and therefore resist deformation more than elements that would be modeled with a smaller spring constant.

The compliant bridge 70 may have a first beam section 80 that generally encompasses the first leg 30, the first shuttle flexural pivot 40, and the first base flexural pivot 44. Similarly, the compliant bridge 70 may have a second beam section 82 that generally encompasses the second leg 32, the second shuttle flexural pivot 42, and the second base flexural pivot 46. The compliant bridge 70 may also have a central portion 84 that includes the shuttle 20.

The curvature of the paths 72, 74 may be somewhat exaggerated in the view of FIG. 1 to distinctly show the first and second configurations 54, 56; the paths 72, 74 may, in reality, be nearly straight. The curvature of the paths 72, 74 may be adjusted to suit the desired force and displacement characteristics of the mechanism 10. Additionally, multiple other factors may also be adjusted to modify the operation of the mechanism 10.

When the input force 11 is applied to the shuttle 20, the shuttle 20 is moved toward the second position 52, thereby pressing the deformable mounts 60, 62 outward. The deformable mounts 60, 62 flex outward to accommodate the increased length of the compliant bridge 70 as the compliant bridge 70 deflects toward a straight configuration. The potential energy present in the mechanism 10 increases as the legs 30, 32 approach a linear alignment; maximum potential energy may be reached at or near the point at which the compliant bridge 70 becomes completely straight.

The maximum potential energy position is the toggle point. At the toggle point, the compliant bridge 70 is in an unstable equilibrium, in which the compliant bridge 70 is equally biased between the first and second configurations 54, 56, each of which has a low potential energy. A slight displacement toward either of the configurations 54, 56 will snap the compliant bridge 70 into one of the configurations 54, 56. If continued force is applied in the direction indicated by the input force 11, the compliant bridge 70 will be urged to bend by the deformable mounts 60, 62 as the deformable mounts 60, 62 relax into a comparatively straight, undeformed, configuration to provide the second stable configuration 56. The deformable mounts 60, 62 may not fully relax in the second configuration 56 due to the continued outward force exerted by the compliant bridge 70.

To actuate the mechanism 10 back to the first configuration 54, a return force, or a load sufficient to deflect the compliant bridge 70 beyond the toggle point, towards the first stable position 54, need only be applied in a direction opposite to that of the input force 11. The magnitude of the return force required to return the mechanism 10 to the first configuration 54 need not be equal to the magnitude of the input force 1I required to actuate the mechanism 10 into the second configuration 56. Indeed, the input force 11 and the return force may be specifically designed to suit the application in which the mechanism 10 is used.

Through the use of compliant technology, a bistable mechanism may be produced without conventional, separate members and joints. The functions of such members and joints are instead carried out by integrally formed elements that allow for motion similar to that of conventional mechanism. While a compliant structure can provide motion and displacement similar to that of designs involving conventional rigid elements, the design process for a compliant mechanism has obstacles not present in the case of conventional mechanisms utilizing separate, rigid parts. For example, the deformable mounts 60, 62 not only serve as spring-type elements to bias the shuttle 20 toward the first position 50 or the second position 52, but they also function as attachments for the first and second base flexural pivots 44, 46. Thus, multiple forces and torques simultaneously act on the deformable mounts 60, 62. Additionally, comparatively large deflections may occur.

As a result, determining how the material flexes requires complex non-liner equations. The complexity of these equations makes it difficult to obtain closed form mathematical relationships between geometric characteristics of the mechanism 10 and the resulting operational characteristics. "Geometric characteristics" refers to physical properties of a compliant structure, including member dimensions, member positions, and material properties. Hence, with traditional methods, it is difficult to create a compliant structure that functions in the desired manner, let alone optimize the structure for a desired function. As mentioned previously, the present invention presents a system and method whereby compliant structures in general can be designed and optimized without the computationally intensive procedures that have been necessary in the past.

More specifically, the process of designing and optimizing a compliant structure can be simplified by modeling a compliant structure as a mechanism with rigid members connected with conventional joints and springs. Such a model may be called a "pseudo-rigid body model," which will be referred to as an analytical model in the following discussion.

Figure 2:
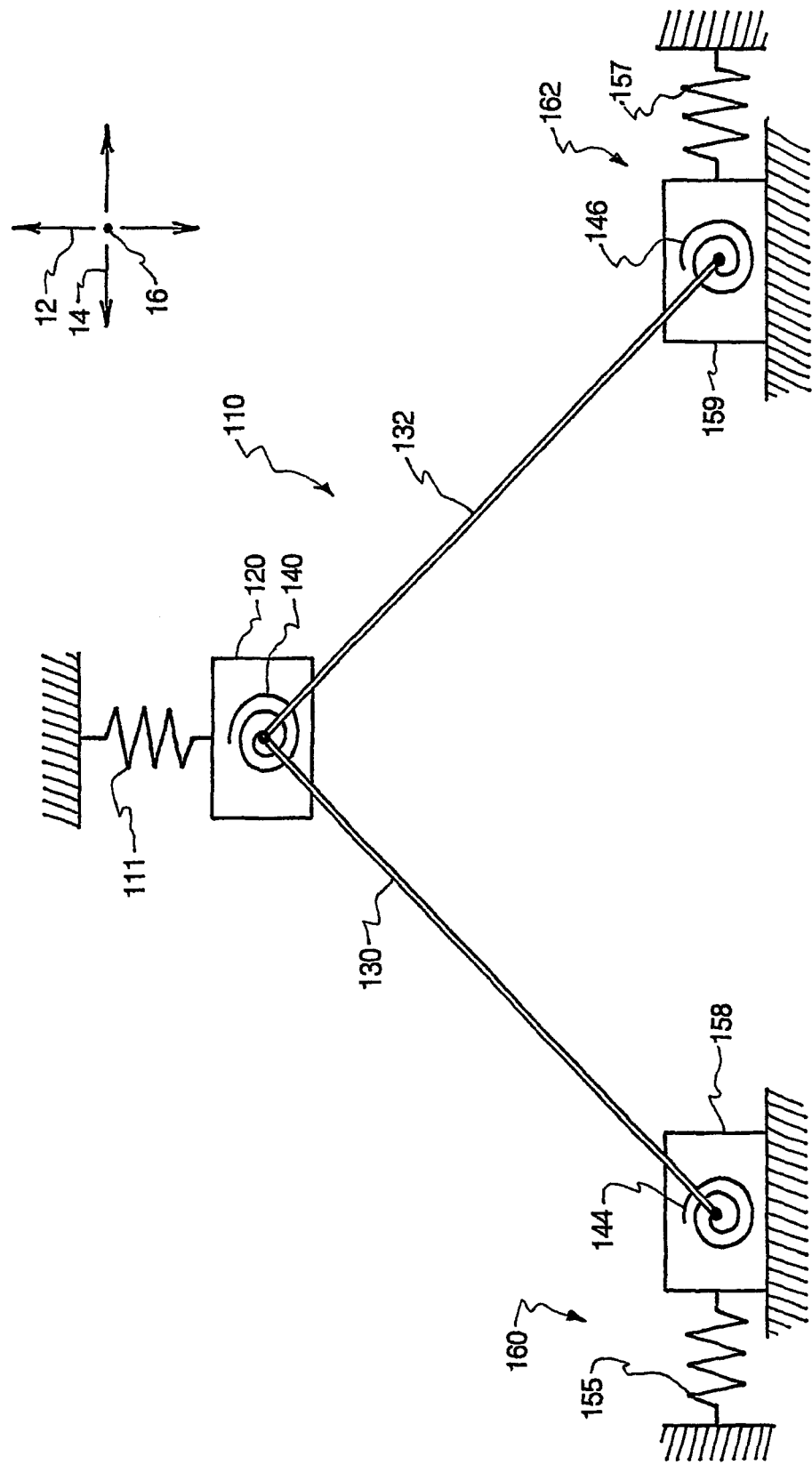
FIG. 2 is a plan view of an analytical model to approximate the operation of the bistable mechanism of FIG. 1.

Referring to FIG. 2, an analytical model 110 of the mechanism 10 of FIG. 1 is depicted. Each elements of the mechanism 10 is present in the analytical model 110. More specifically, the input force 11 may be modeled as a longitudinal spring 111 with a linear configuration. Such a force may be applied by an actuator affixed to the shuttle 20, which may resist longitudinal motion of the shuttle 20 in either direction until the actuator is triggered. However, if the input force 11 does not vary in linear fashion with the displacement of the shuttle 20, some other model may be more appropriate. For example, if the shuttle 20 is part of an accelerometer and is actuated only by its own weight, the longitudinal spring 111 may be removed entirely from the analytical model 110, or negated by setting its spring constant to zero. The shuttle 20 may be represented by a longitudinal slider 120 that moves only in the longitudinal direction 12 by virtue of the symmetry of the model 110.

The legs 30, 32 may be modeled as legs 130, 132, which are connected by pin joints and torsional springs. More precisely, the first and second shuttle flexural pivots 40, 42 may be modeled with a single pin joint/torsional spring combination 140 on the slider 120. The torsional spring of the pin joint/torsional spring combination 140 represents the resistance of the shuttle flexural pivots 40, 42 to bending. The first and second base flexural pivots 44, 46 may be modeled as first and second pin joint/torsional spring combinations 144, 146 attached to the legs 130, 132. The torsional springs of the pin joint/torsional spring combinations 144, 146 represent the resistance of the base flexural pivots 44, 46 to bending.

The resilient force of the first mounting beam 58 may be represented by a first lateral spring 155, and the resilient force of the second mounting beam 59 may be represented by a second lateral spring 157. The pin joint/torsional spring combinations 144, 146 may be attached to first and second lateral sliders 158, 159, respectively, which represent the physical attachment provided by the first and second mounting beams 58, 59. The lateral sliders 158, 159 may be constrained to move in the lateral direction 14 by the longitudinal symmetry of the deformable mounts 60, 62. The combination 160 of the first lateral spring 155 with the first lateral slider 158 may be analogous to the first deformable mount 60, and the combination 162 of the second lateral spring 157 with the second lateral slider 159 may be analogous to the second deformable mount 162.

The analytical model 110 has many "analytical model characteristics," each of which can be changed to alter the operational characteristics of the model 110. The analytical model characteristics are analogous to the geometric characteristics of the compliant structure. For example, the legs 130, 132 each have a length and a rest angle with respect to the lateral direction 14. Each of the pin joint/torsional spring combinations 140, 144, 146 may have a spring constant that indicates the strength of the torsional spring. Each of the linear springs 111, 155, 157 may also have spring constants. Mathematical relationships between the analytical model characteristics and operational characteristics of the analytical model 110 may be determined using traditional tools of kinematic analysis. The analytical model characteristics may be altered to simulate different configurations of the mechanism 10 in its compliant form.

This type of pseudo-rigid body modeling can be applied to many different compliant structures besides bistable micromechanisms. After creating an analytical model of the compliant structure, conventional techniques can be applied to the analytical model to obtain closed form equations that relate operational characteristics to analytical model characteristics, such as the dimension, orientation, stress, force, thickness, or width. When the desired analytical model characteristics have been determined, a compliant design may be produced so that comparable operational characteristics can be obtained. This process of creating an analytical model of a compliant structure and then characterizing the structure with conventional rigid body equations allows for a large number of candidate designs to be considered for any given application. Additionally, once a feasible analytical model is determined, the model may be optimized to make the structure perform a specific function in a predetermined manner.

The initial step in optimizing a compliant structure is to determine the desired operational characteristics of the mechanism. For example, the maximum stress on the structure elements, such as the small-length flexural pivot, must be lower than the yield strength of the material to prevent failure. As another example, it may be desirable to minimize an input force, maximize an output force, maximize an output displacement, or obtain some other objective characteristic.

The mechanism 10 in FIG. 1 may be designed through the use of such an optimization process. The mechanism 10 has several geometric characteristics that must be considered when performing an optimization process. First, the mechanism 10 is to be stable in two different configurations 54, 56. Bistable design can be difficult to achieve because of the complexity inherent in compliant mechanisms; the interactions of flexible members, analysis of large deformations, and the like make it difficult to determine which sets of geometric characteristics will provide a bistable design. However, through the use of an analytical model like that of FIG. 2,;multiple bistable configurations may be found.

More specifically, certain ranges of analytical model characteristics may be determined to yield bistable operation; such ranges may then form the parameters of further analysis to select the best specific configuration. Which bistable configuration is the best depends on the desired operational characteristics. One operational characteristic may be selected and designated an "objective characteristic," or the operational characteristic that is to be obtained through the optimization process. The objective characteristic may be a target value, such as a desired threshold input force to move the mechanism 10 from the first configuration 54 to the second configuration 56. In the alternative, the objective characteristic may be a value that is to be maximized or minimized; for example, the displacement of the shuttle 20 between the first and second positions 50, 52 may be minimized.

Figure 3:
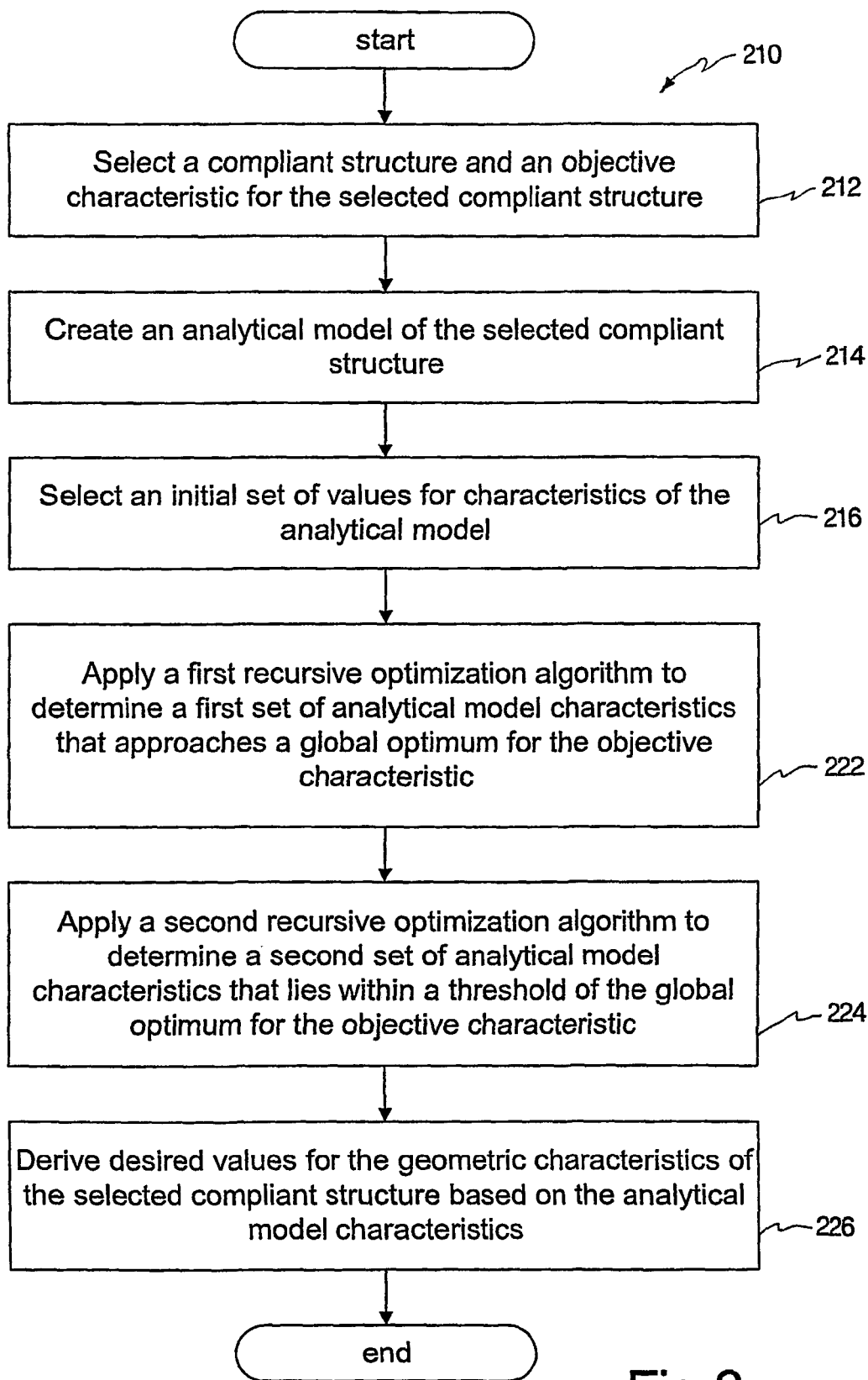
FIG. 3 is a flowchart diagram showing one embodiment of an optimization process for compliant mechanisms.

Referring to FIG. 3, a flowchart depicts one example of an optimization process 210 according to the present invention. As mentioned previously, the optimization process 210 is applicable not only to bistable mechanisms or MEMS, but can be used for compliant mechanisms in general. As described previously, the first step may be to select 212 a compliant structure, such as the mechanism 10 of FIG. 1, and an objective characteristic to be optimized. For the mechanism 10, the objective characteristic may be the displacement between the first and second positions 50, 52 of the shuttle 20. Alternatively, a plurality of objective characteristics may be selected and simultaneously optimized.

After the compliant structure and the objective characteristic have been chosen, an analytical model, such as the model 110 of FIG. 2, may be created 214. Traditional analysis of rigid body members may be used to obtain mathematical relationships that relate the objective characteristic to characteristics of the analytical model, such as member lengths and angles, spring constants, and the like. Such mathematical relationships may consist of closed form equations that can be readily applied by a computer in an iterative process.

Alternatively, a compliant structure may be optimized without using an analytical model if a different form of analysis is used. For example, the compliant structure may be modeled by computer through the use of finite element analysis or a similar method. Finite element analysis creates a geometric model of the compliant structure by dividing the compliant structure into a large number of small geometric shapes, such as tetrahedrons. A computer then utilizes an iterative process involving simultaneous sets of equations to determine how the structure will respond to loads.

Thus, the finite element method may be used to evaluate multiple configurations of the selected compliant structure without creating closed form mathematical relationships. However, finite element analysis is computationally intensive, and would have to be performed with each iteration of an optimization algorithm. Consequently, optimization through finite element analysis may be too time consuming to be practical. Therefore, the following discussion assumes the use of an analytical model.

Returning to FIG. 3, once the analytical model has been created 214, initial values of the characteristics of the analytical model should be selected 216. The initial values may simply be a guess as to what may be close to the optimal values of the analytical model characteristics; such a guess may be made through analysis of the model, experimentation, or experience.

A first recursive optimization algorithm may then be applied 222 to the analytical model. In general, the first recursive optimization algorithm takes the initial set of values for the analytical model characteristics and performs an iterative process to approach a global optimum, or a set of analytical model characteristics that will produce the most desirable value of the objective characteristic. In the exemplary process 210 of FIG. 4, the main purpose of applying 222 the first recursive optimization algorithm is not necessarily to find the global optimum itself, but to find the general region in which the global optimum lies among local optima. This concept will be illustrated with greater clarity in FIG. 4.

The first recursive optimization algorithm may return a first set of values of the analytical model characteristics; the first set of values bring the objective characteristic near a global optimum. A second recursive optimization algorithm may then be applied 224. The second recursive optimization algorithm may receive the first set of values of the analytical model characteristics and may perform iterative steps to obtain a second set of values of the analytical model characteristics that provide a value of the objective characteristic within a tighter threshold of the global optimum. The threshold is necessary because the second recursive optimization algorithm may otherwise come infinitely close to the global optimum without actually reaching it.

Once the second set of analytical model characteristics has been obtained, the analytical model characteristics are utilized to derive 226 the geometric characteristics of the selected compliant structure that will obtain a similar result. Derivation of the geometric characteristics from the analytical model characteristics may be accomplished by utilizing known relationships between compliant structures and their rigid body approximations. For example, a torsional spring constant from the analytical model 110 may be used to determine a thickness for a small-length flexural pivot so that the small-length flexural pivot simulates the torsional spring constant in operation. Other geometric characteristics, such as member lengths, materials, member angles, and the like may be determined in a similar manner, i.e., by comparison with the second set of values of the analytical model characteristics.

The optimization process 210 is only one example of an optimization method according to the present invention; many other processes may also be used. As mentioned above, a different method of analysis, such as the finite element method, may be used in place of creating 214 the analytical model. Additionally, rather than applying 222 a first recursive optimization algorithm and applying 224 a second recursive optimization algorithm, a single optimization algorithm may be used to approach the global optimum and come within the threshold value.

Figure 4:
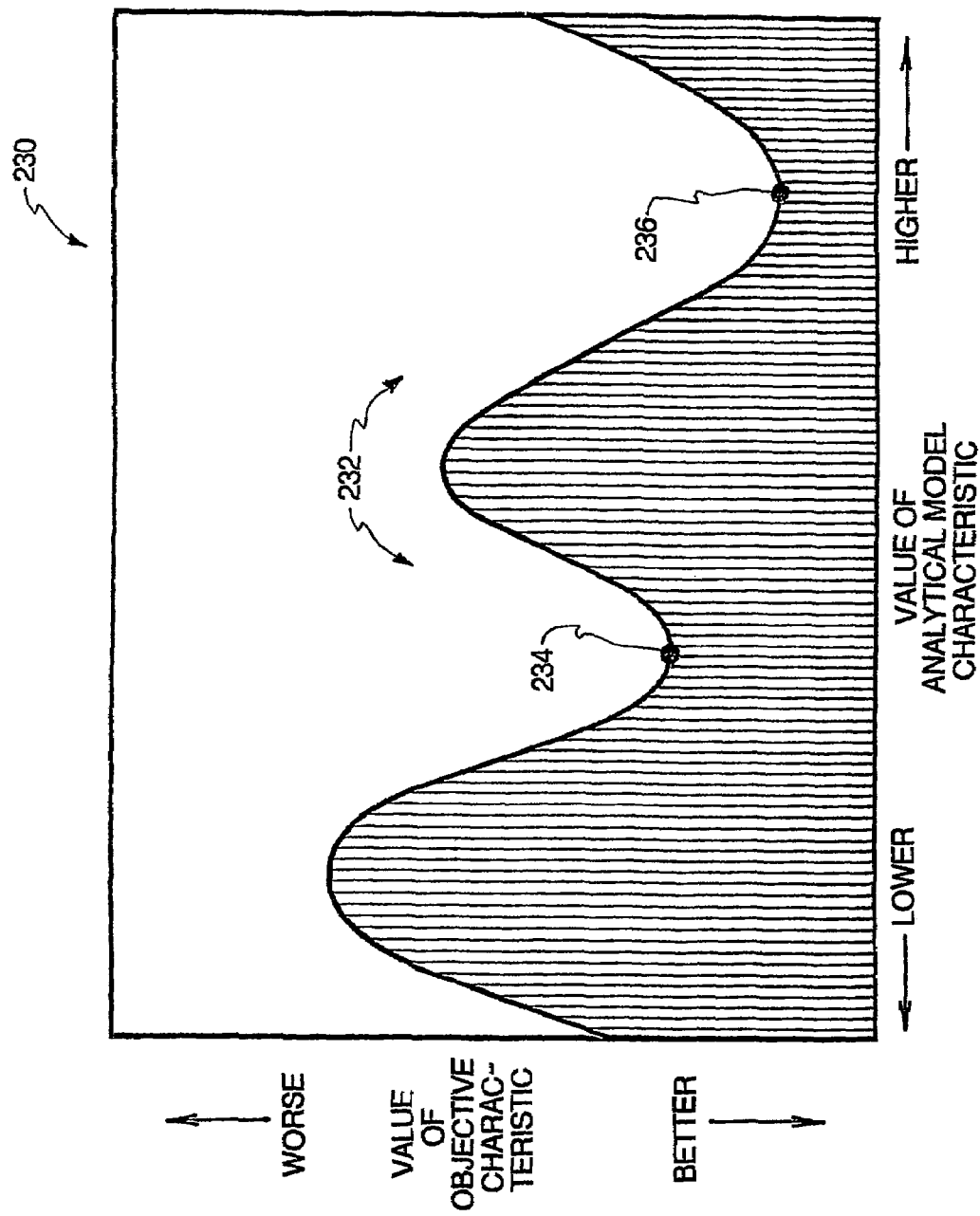
FIG. 4 is a graph showing a local optimum and a global optimum for an objective characteristic to be optimized over a single analytical model characteristic.
Figure 5:
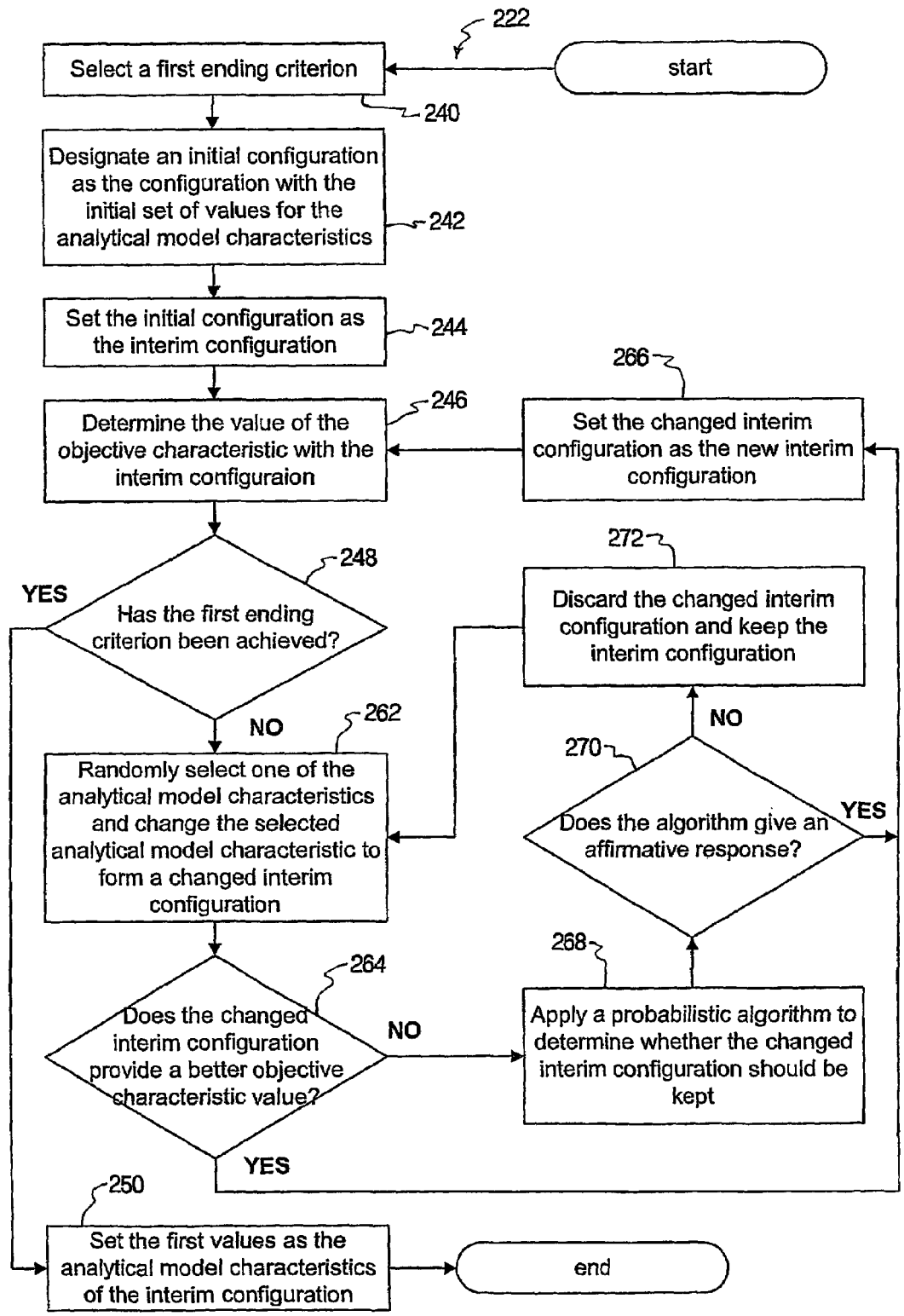
FIG. 5 is a flowchart diagram showing one embodiment of a first recursive optimization algorithm suitable for the optimization process of FIG. 3.
Figure 6:
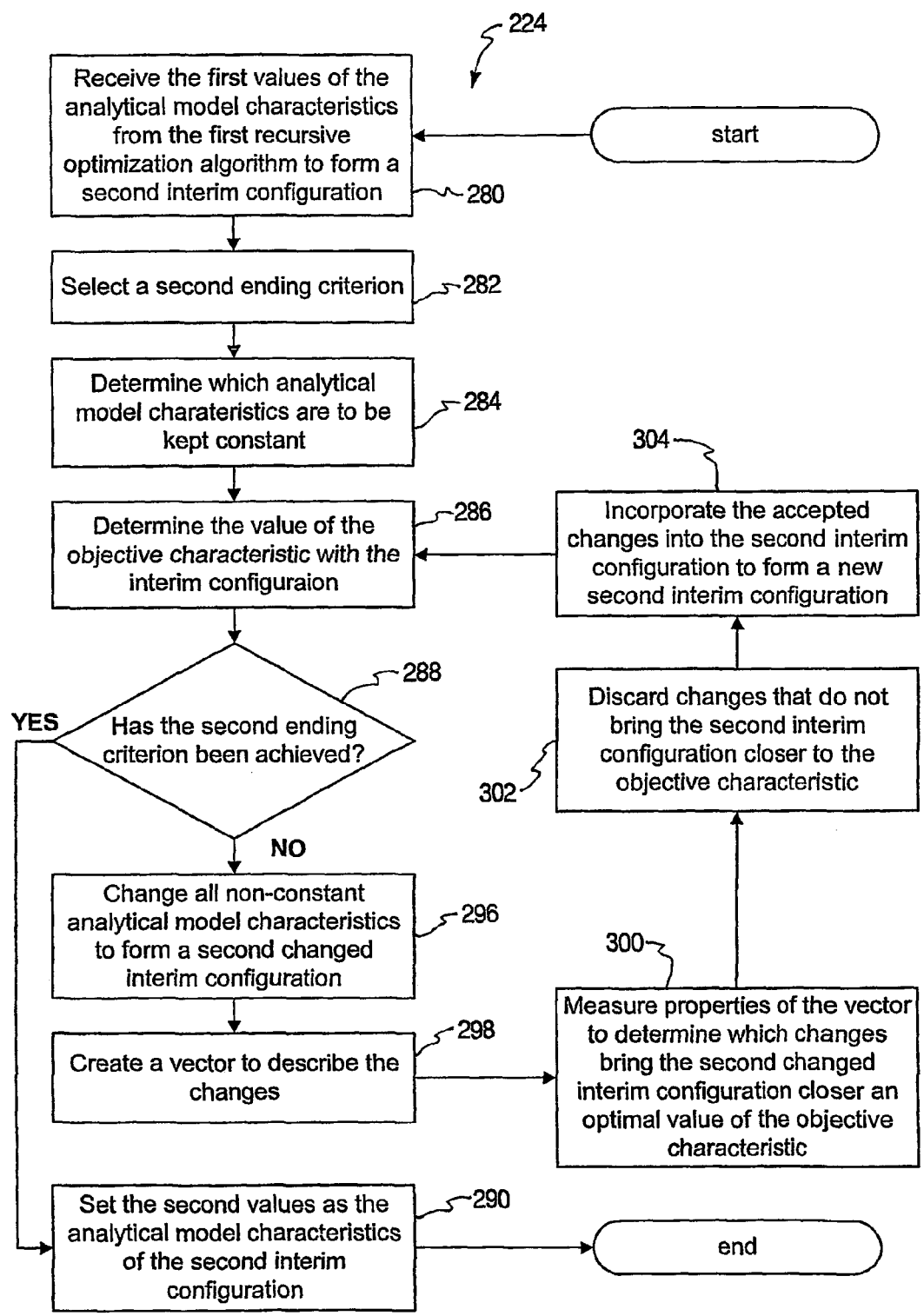
FIG. 6 is a flowchart diagram showing one embodiment of a second recursive optimization algorithm suitable for the optimization process of FIG. 3.

Hence, steps of the optimization process 210 may generally be omitted, modified, and/or added to create new embodiments. However, the following discussion is based on the optimization process 210. FIG. 4 is a graphical illustration of local and global optima; FIG. 5 provides additional detail regarding the operation of one embodiment first recursive optimization algorithm, and FIG. 6 provides additional detail regarding the operation of one embodiment of the second recursive optimization algorithm.

Referring to FIG. 4, a graph 230 shows the value of the objective characteristic, mapped against the value of one analytical model characteristic. Although optimization will most likely be carried out by varying multiple analytical model characteristics, the two-dimensional representation of FIG. 4 is somewhat easier to describe and understand. Those of skill in the art will recognize that the principles described below are equally applicable to optimization processes in which multiple characteristics are simultaneously changed.

The vertical axis represents the value of the objective characteristic, such as the actuation force required to move the shuttle 20 of the mechanism 10 of FIG. 1, between the first and second positions 50, 52. In this embodiment, it is desirable for the actuation force to be as low as possible. The horizontal axis represents the value of the analytical model characteristic that is to be varied to optimize the objective characteristic. The domain depicted by the horizontal axis represents the feasible design area for the analytical model characteristic that is to be varied.

As shown in FIG. 4, there are multiple valleys 232 in which feasible designs come to relatively low (i.e., desirable) values of the objective characteristic. One of the valleys 232 contains a local optimum 234, which is a lowest value of the objective characteristic within the valley 232 in which the local optimum 234 is present. The other valley 232 contains a global optimum 236, which is a lowest value of the objective characteristic within the entire feasible range of the analytical model characteristic. If a high value of the objective characteristic were desirable, local and global optima may be peaks instead of valleys.

If the optimization process is not robust enough, the optimization algorithm may only obtain a local optimum, which would produce a less desirable design. Many optimization algorithms tend to return the optimum closest to the initial value provided to the algorithm. Consequently, if the initial value of the analytical model characteristic falls within the valley 232 in which the local optimum 234 resides, such an optimization process would likely return only the local optimum 234, without finding the global optimum 236 that provides the best solution.

In order to avoid the local optimum problem, the optimization process 210 of FIG. 3, applies 222 the first recursive optimization algorithm primarily for the purpose of escaping from local optima, such as the optimum 234. The optimization process 210 then applies 224 the second recursive optimization algorithm to find the value of the analytical model characteristic that will be within a smaller threshold of the global optimum 236.

Referring to FIG. 5, a more detailed flowchart depicts steps that may be followed to apply 222 the first recursive optimization algorithm. The first recursive optimization algorithm may be any algorithm known in the art of mechanical design. As mentioned previously, the first recursive optimization algorithm may be used alone, if desired. The following discussion simply provides an example of one first recursive optimization algorithm that may be used in conjunction with a second recursive optimization algorithm to obtain robust and accurate results.

More precisely, the first recursive optimization algorithm may comprise a process known as simulated annealing. Other stochastic methods, such as genetic algorithms, neural networks, and the like may also be used; however, the following discussion assumes that simulated annealing is the selected method. The simulated annealing process utilizes random decision-making to ensure that the process is able to move between the valleys 232. A first ending criterion may first be selected 240. The first ending criterion may be a required value of the objective characteristic that must be obtained or passed in the positive or negative direction, a maximum number of iterations, a maximum change in the objective characteristic per iteration, or the like. An initial configuration may then be designated 242 as the configuration with the initial set of values that were selected 216 previously.

The initial configuration may be set 244 as the interim configuration. The value of the objective characteristic 246 may then be determined for the interim configuration. The value of the objective characteristic may be obtained through the use of closed form equations from an analytical model of the selected compliant structure, from a computerized process such as finite element analysis, or even through solving the complex equations involved with direct analysis of the selected compliant structure.

Once the value of the objective characteristic has been determined, the first recursive optimization algorithm may then determine 248 whether the first ending criterion has been achieved. As mentioned above, the first ending criterion may take a wide variety of forms, and may be tied to the value of the objective characteristic. If the first ending criterion has been achieved, the first recursive optimization algorithm may then set 250 the first values for the analytical model characteristics as the values of the interim configuration. The first values may then be returned by the first recursive optimization algorithm.

If the first ending criterion has not been achieved, the first recursive optimization algorithm may then randomly select 262 one of the analytical model characteristics and change the selected analytical model characteristic to form a changed interim configuration. Not all of the analytical model characteristics need be subject to change; some may be designated as characteristics to be held constant. The magnitude of the change may also be randomly determined if desired, or may be based in whole or in part on factors such as the results of previous iterations, the type of analytical model characteristic that has been selected at random, or the like. The first recursive optimization algorithm may then determine 264 whether the changed interim configuration provides a better value of the objective characteristic than the original interim configuration.

In order to determine 264 which configuration is preferable, the value of the objective characteristic may be calculated or retrieved, if it has already been determined and stored, for the interim configuration and for the changed interim configuration. For example, if the objective characteristic is minimization of the actuation force, whichever configuration provides the lowest actuation force provides the best value of the objective characteristic.

If the changed interim configuration provides the better result, the changed interim configuration may be unconditionally set 266 as the new interim configuration. The old interim configuration may be discarded. The value of the objective characteristic may then be determined 246 with the new interim configuration to begin the cycle again.

If the changed interim configuration does not provide the better result, a probabilistic algorithm may be applied 268 to determine whether the changed interim configuration should be kept. The probabilistic algorithm may be as simple as the computer equivalent of a coin toss, or may be based in whole or in part upon other factors such as the difference between the values provided by the two configurations, the history of the recursive process, or the like. The first recursive optimization algorithm may determine 270 the results of the algorithm, and if the probabilistic algorithm dictates that the changed interim configuration is to be kept, the changed interim configuration may be set 266 as the new interim configuration.

The probabilistic algorithm may also dictate that the changed interim configuration should be discarded 272, in which case the old interim configuration is kept, and the cycle may begin again. Reiteration with the same interim configuration will not necessarily yield the same result with each iteration because the first recursive optimization algorithm may randomly select 262 the analytical model characteristic to change, and possibly even the magnitude of the change. In all likelihood, the interim configuration will be redefined numerous times throughout the optimization process. Once the first ending criterion has been met, the first values 250 are set as the values of the interim configuration.

The random acceptance or rejection of an inferior interim configuration allows the first recursive optimization processes to escape local optima. As can been seen in FIG. 4, were a configuration to be within the valley 232 of a local optimum 234, an optimization process may need to select a number of inferior designs in order to find the global optimum 236. In the case of the simulated annealing method, the algorithm that selects or rejects an inferior design may be based upon a cooling schedule of metal. The annealing processes would select fewer and fewer inferior designs as the process cycled. The probabilistic algorithm applied by the first recursive optimization algorithm may operate in a similar manner.

After the first recursive optimization algorithm has been applied 222, a first set of values of the analytical model characteristics may be returned by the first recursive optimization algorithm. The first set of values may simply be one set of values that positions the objective characteristic somewhere within the valley 232 in which the global optimum 236 resides. The second recursive optimization algorithm may then be applied 224 to obtain a second set of values that are within a specified threshold of the global optimum 236.

Referring to FIG. 6, a more detailed view of the operation of the second recursive optimization algorithm is depicted. The second recursive optimization algorithm need not be designed to avoid local optima, but may simply operate to remain within the valley 232 in which the first values of the analytical model characteristics lie. Consequently, gradient analysis may be effectively used in conjunction with the second recursive optimization algorithm. Consequently, the second recursive optimization algorithm may comprise the generalized reduced gradient method or a similar optimization process. Other gradient-driven methods, such as sequential quadratic programming, linear programming, and the like, may also be used, but the following discussion assumes the use of the generalized reduced gradient method.

The second recursive optimization algorithm may first receive 280 the first values of the analytical model characteristics, and designate a second interim configuration as the configuration having analytical model characteristics with the first values. A second ending criterion may then be selected 282. Like the first ending criterion, the second ending criterion may take a variety of forms, and may be based upon the value of the objective characteristic.

The second ending criterion may be somewhat more restrictive than the first ending criterion; for example, the second ending criterion may require a comparatively small threshold distance between the global optimum 236 and the value of the objective characteristic. Such a criterion may be measured, for example, by measuring the differences between the values of the objective characteristics in successive iterations. Very small differences may indicate that the value of the objective characteristic that is obtained is near the global optimum 236.

The second recursive optimization algorithm may then determine 284 which analytical model characteristics are to be kept constant during iteration. Changing a larger number of the analytical model characteristics may provide a better result because each additional dimension of the analysis provides the possibility for a lower global optimum. For example, if the graph 230 of FIG. 4 were expanded to three dimensions, the new dimension may well provide a global optimum more desirable than the global optimum 236 that is available through variation of only one of the analytical model characteristics. However, changing a smaller number of analytical model characteristics may expedite the procedure, and may avoid introducing geometric characteristics that are not viable from a manufacturing standpoint.

The value of the objective characteristic may then be determined 286 with the second interim configuration. The second recursive optimization algorithm may then determine 288 whether the second ending criterion has been achieved. If so, the second values may be set 290 as the values of the analytical model characteristics of the second interim configuration. If the second ending criterion has not been met, all of the values of the non-constant analytical model characteristics may be changed to provide a second changed interim configuration. The changes may have a random component, or may be determined entirely by factors such as the effects of changes in past iterations on the objective characteristic.

A vector may then be created 298 to describe the changes made to the analytical model characteristics. The vector may take the form of an ordered number set including all changes made. Properties of the vector may be measured 300 to determine which changes are improvements and which are not, e.g., which changes bring the second changed interim configuration comparatively closer to the global optimum 236. Such properties may be measured through the use of partial derivatives; the partial derivative of each analytical model characteristic with respect to the objective characteristic indicates the effect that changes to that analytical model characteristic have on the objective characteristic.

After the vector has been analyzed, the changes that have not had a positive influence on the second interim configuration may be discarded 302. The remaining changes may be incorporated 304 into the second interim configuration to form a new second interim configuration. Thereafter, the process may continue cyclically until the second ending criterion has been achieved.

The result of the second recursive optimization algorithm is to provide the second set of values of the analytical model characteristics, which will provide the globally optimum value for the objective characteristic within a comparatively tight threshold. If desired, such a result could be obtained solely with the first recursive optimization algorithm. However, the randomized nature of the simulated annealing algorithm may make accurate determination of the global optimum a comparatively time-consuming process. Thus, the use of the second recursive optimization algorithm may make the optimization process faster and more accurate.

As mentioned previously, design and optimization methods presented herein are applicable to a wide variety of compliant mechanisms besides the mechanism 10 of FIG. 1. Additionally, bistable MEMS devices according to the invention may be designed in other ways besides those outlined in FIGS. 3, 5, and 6. Many bistable configurations are possible aside from the mechanism 10 of FIG. 1. Some such configurations will be shown and described in connection with FIGS. 7 through 10.

Figure 7:
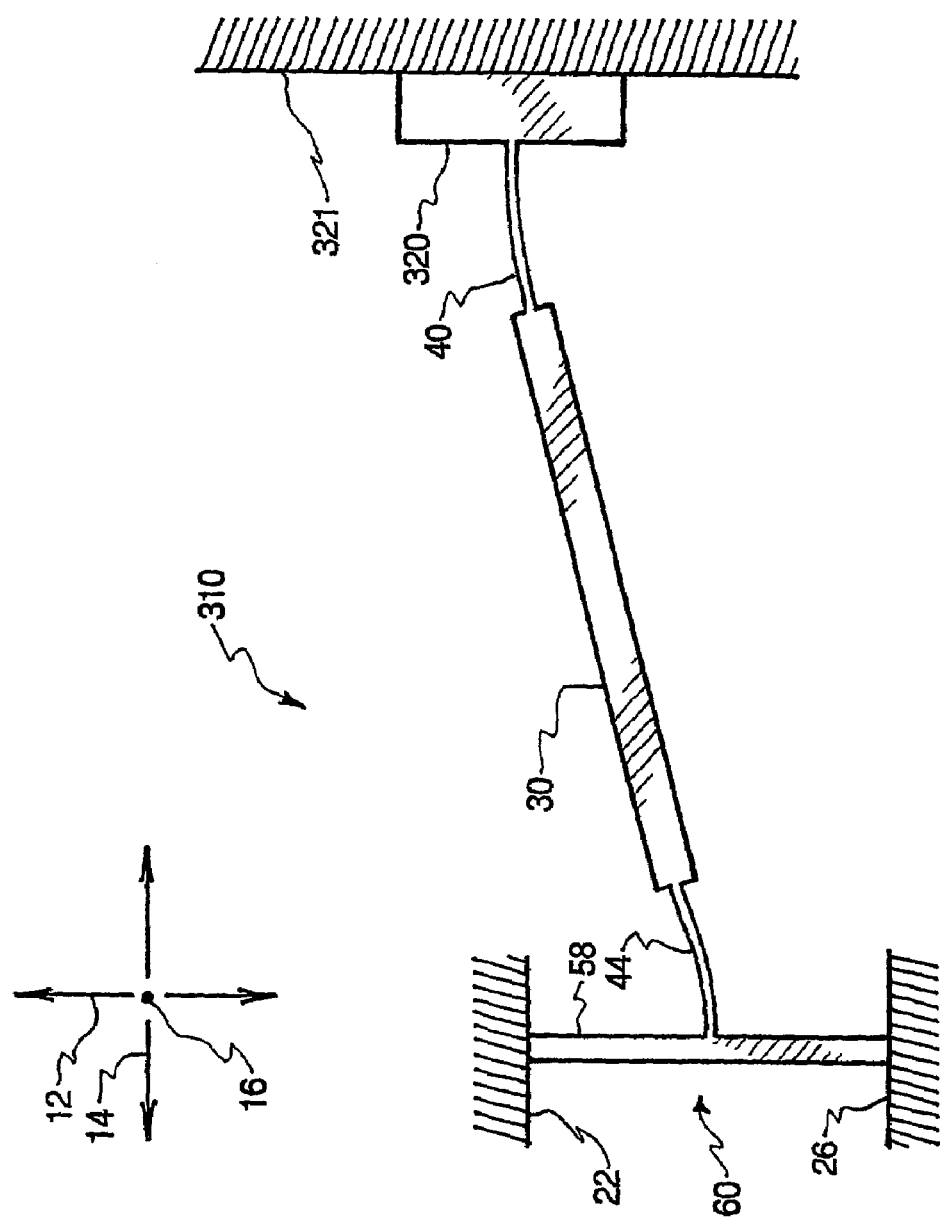
FIG. 7 is a plan view of an alternative embodiment of a compliant bistable mechanism according to the invention.

Referring to FIG. 7, an alternative embodiment of a mechanism 310 with bistable properties is depicted; the mechanism 310 may also be sized for MEMS applications. The mechanism 310 of FIG. 7 may have elements similar to those of the mechanism 10 of FIG. 1; however, the mechanism 310 may not have dual, laterally symmetrical portions. The mechanism 310 may, for example, have a shuttle 320 disposed to move in the longitudinal direction 12, much like the shuttle 20 of FIG. 1. The first and third base members 22, 26, the first leg 30, the first shuttle flexural pivot 40, the first base flexural pivot 44, and the first mounting beam 58 may be substantially as shown and described in connection with FIG. 1. As with FIG. 1, the first base member 22, the third base member 26, and the first mounting beam 58 may form the first deformable mount 60.

The shuttle 320 may be integrally formed with and coupled to the first shuttle flexural pivot 40. However, in place of the second shuttle flexural pivot 42, the shuttle 320 may simply abut a surface 321 against which the shuttle 320 is able to slide. Thus, the lateral distance between the first deformable mount 60 and the shuttle 320 is fixed. The shuttle 320 is constrained to move longitudinally, like the shuttle 20 of FIG. 1; consequently, the shuttle 320 may move in a manner similar to the shuttle 20.

The first deformable mount 60 may flex outward as the shuttle 320 moves toward the toggle point in order to accommodate the aligned lengths of the shuttle 320, the first leg 30, and the flexural pivots 40, 44. The shuttle 320 may be then snap into one of two low potential energy positions as the first deformable mount 60 pushes inward, toward its undeformed configuration. The mechanism 310 is simple in design, and may be actuated between stable configurations with about half the input force required to actuate the mechanism 10, assuming that the displacement of the shuttle 320 between low potential energy positions is the same as that of the shuttle 20, and that the surface 321 provides negligible friction. A low input force may be beneficial for some applications, but may also cause instability in other applications.

Stability is generally proportional to the force required to toggle a bistable mechanism from one low potential energy configuration to another low potential energy configuration. An embodiment requiring a small force to toggle the mechanism is not as stable as a mechanism that requires a large force. Nevertheless, a highly stable mechanism will require a comparatively larger force to actuate the mechanism between different stable configurations. A high input force may place excessive energy burdens on a system, especially in MEMS applications, in which energy consumption is limited. In such applications, minimizing the toggle force may be desirable.

However, stability may be compromised if the toggle force is too low. For example, vibrations that occur from outside the system may toggle a bistable mechanism with a small input force requirement. Therefore, the application and energy requirements must be considered when selecting a bistable mechanism design. One method of increasing stability is to increase the number of legs in the bistable mechanism. Increasing the number of legs also increases the input force required to toggle the mechanism.

Figure 8:
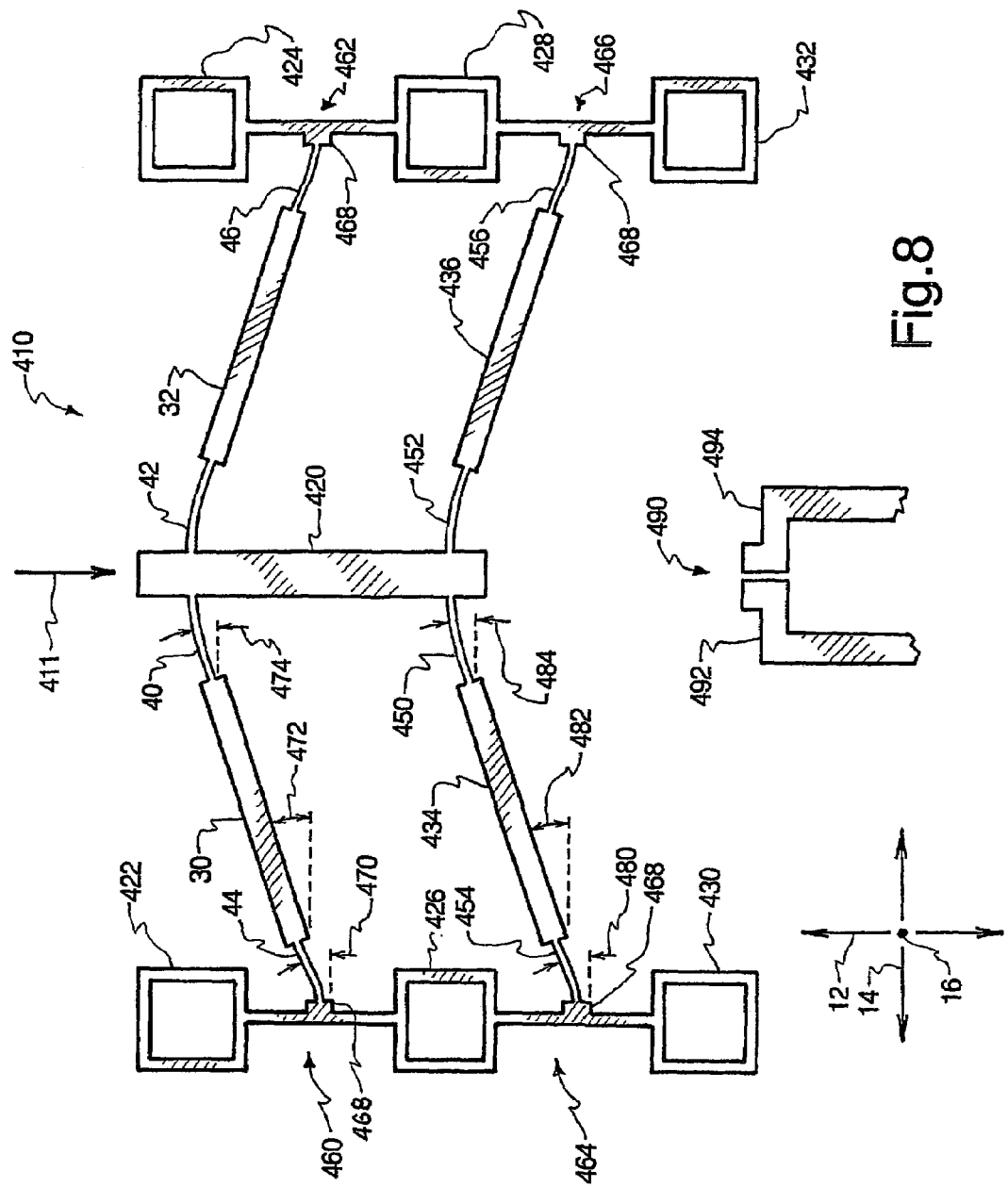
FIG. 8 is a plan view of another alternative embodiment of a compliant bistable mechanism according to the invention.

Referring to FIG. 8, another embodiment of a mechanism 410 according to the invention is depicted; the mechanism 410 may also be sized for MEMS applications, and may also be bistable. As depicted in FIG. 8, the mechanism 410 may receive an input force 411, and may have a shuttle 420 disposable between two stable positions. The shuttle 420 may be connected to a first base member 422, a second base member 424, a third base member 426, a fourth base member 428, a fifth base member 430, and a sixth base member 432.

The shuttle 420 may be coupled to the first and third base members 422, 426 by a first leg 30 and to the second and fourth base members 424,428 by a second leg 32. Additionally, the shuttle 420 may be coupled to the third and fifth base members 426, 430 by a third leg 434 and to the fourth and sixth base members 428, 432 by a fourth leg 436. The first and second arms 30, 32 may be integrally formed with and coupled to first and second shuttle flexural pivots 40, 42, and to first and second base flexural pivots 44, 46. Similarly, the third and fourth arms 434, 436 may be integrally formed with and coupled to third and fourth shuttle flexural pivots 450, 452, and to third and fourth base flexural pivots 454, 456.

The first, third, and fifth base members 422, 426, 430 may be connected in series, and the second, fourth, and sixth base members 424, 428, 432 may be similarly connected in series. Thus, a first deformable member 460, a second deformable member 462, a third deformable member 464, and a fourth deformable member 466 are formed; each of the deformable members 460, 462, 464, 466 is coupled to one of the base flexural pivots 44, 46, 454, 456, respectively. The deformable members 460, 462, 464, 466 may be like those 60, 62 of FIG. 1, with the addition of stubs 468 to which the base flexural pivots 44, 46, 454, 456 are attached. The stubs 468 may help to avoid plastic deformation in the junctures between the deformable members 460, 462, 464, 466, and the base flexural pivots 44, 46, 454, 456. Without the stubs 468, stresses may concentrate in the junctures between the deformable members 460, 462, 464, 466 and the base flexural pivots 44, 46, 454, 456.

The use of multiple sets of legs 30, 32, 434, 436 may prevent the shuttle 420 from rotating or twisting in a non-linear path. Such rotating or twisting may cause the shuttle 420 to toggle in an unpredictable manner. Also, the additional legs 434, 436 increase the amount of force required to actuate the mechanism 420. As discussed above, the actuation force generally corresponds to the amount of force that is required to deflect the deformable mounts 460, 462, 464, 466 enough to allow the shuttle 420, legs 30, 32, 434, 436, and flexural pivots 40, 42, 44, 46, 450, 452, 454, 456 to linearly align at the toggle point.

The addition of two more deformable members 464, 466 constitutes additional potential energy that must be added to the mechanism 410 by the actuating force to toggle the shuttle 420. Thus, by adding third and fourth legs 434, 436 and third and fourth deformable mounts 464, 466, the amount of force required to move the mechanism 410 from the first stable configuration to the second stable configuration is roughly double that of the mechanism 10 of FIG. 1. As a result of the greater required actuating force, greater stability is similarly obtained. The mechanism 410 effectively has two compliant bridges, one of which extends from the first deformable mount 460 to the second deformable mount 462, and another of which extends from the third deformable mount 464 to the fourth deformable mount 466.

As shown in FIG. 8, the base members 422, 424, 426, 428, 430, 432 may take the form of enclosed anchors 422, 424,426, 428, 430, 432. The anchors 422, 424,426, 428,430, 432 may be affixed to a silicon substrate in stationary fashion. FIG. 8 also depicts the third and fourth anchors 426, 428 as common elements of the first and third deformable mounts 460, 464 and the second and fourth deformable mounts 462, 466, respectively. This allows for material and size reduction, and also creates separately deflecting deformable mounts 460, 462, 464, 466 for each of the legs 30, 32, 434, 436. Attaching each of the legs 30, 32, 434, 436 to a single deformable mount 460, 462, 464, 466 simplifies the design of the mechanism 410 and the calculation of the input force 411 required to toggle the mechanism 410.

However, the mechanism 410 may also be designed without the third and fourth base members 426, 428, so that the first and third legs 30, 434 are attached to a common deformable mount extending between the first and fifth base members 422, 430, and the second and fourth legs 32, 436 are also attached to a common deformable mount (not shown) extending between the second and sixth base members 424, 432. The deformable mounts would operate in a manner similar to that described above, but with a slightly different type of deformation. Such an elongated deformable mount may beneficially allow for further material and size reduction. Another alternative embodiment may have a single central anchor (not shown) with two cantilevered beams extending from opposite sides of the central anchor. The legs 30, 32, 434, 436 may then be coupled to the ends of the cantilever beams to provide the required inward force to produce bistable operation.

Another way of controlling the stability of a bistable mechanism such as the mechanism 410 of FIG. 8 is by adjusting the orientations of the mechanism elements with respect to each other. The relative angles of the elements control the function of the mechanism. Various angles of the mechanism 410 may be varied through a wide range of values to create an infinite number of operational variations. This allows a mechanism like the mechanism 410 to be custom designed to suit individual applications and constraints.

More specifically, the mechanism 410 may be manufactured with certain angles 470, 472, 474, 480, 482, 484 in an undeformed configuration, which will be assumed to be the first stable configuration of the mechanism 410. A first base pivot angle 470 may be the angle at which the first and second base flexural pivots 44, 46 extend from the first and second deformable mounts 460, 462. A first leg angle 472 may be the angle at which the first and second legs 30, 32 extend from the first and second base flexural pivots 44, 46. A first shuttle pivot angle 474 may be the angle at which the first and second shuttle flexural pivots 40, 42 extend from the first and second legs 30, 32. A second base pivot angle 480, a second leg angle 482, and a second shuttle pivot angle 484 may be analogous to the first angles 470, 472, 474, but with reference to the third and fourth base flexural pivots 454, 456, the third and fourth legs 434, 436, and the third and fourth shuttle flexural pivots 450, 452.

If the angles 470, 472, 474, 480, 482, 484 are not selected correctly, the mechanism 410 may not be bistable. For example, the angles 470, 472, 474, 480, 482, 484 should all be positive, i.e., in the direction shown, so that the legs 30, 32, 434, 436 do not compress into a zigzag configuration with the flexural pivots 40, 42, 44, 46, 450, 452, 454, 456 when the input force 411 is applied. Similarly, the angles 470, 474, 480, 484 should preferably not be too extreme to avoid zigzagging and/or the buildup of concentrated bending stresses at the locations where the flexural pivots 40, 42, 44, 46, 450, 452, 454, 456 attach to the shuttle 420, the legs 30, 32, 434,. 436, and/or the deformable mounts 460, 462, 464, 466.

The first angles 470, 472, 474 need not be the same as the second angles 480, 482, 484. If desired, different angles may be used for analogous parts of the mechanism 410 to obtain a specific input force-to-displacement curve, additional stable configurations, or the like.

FIG. 8 further demonstrates the use of the mechanism 410 as a compliant, bistable electrical switch. In this embodiment, the shuttle 420 may be positioned to close an electric circuit when actuated to the second stable configuration. More specifically, the shuttle 420 may positioned to abut an output force receiver 490, in the form of an electrical connection 490, in the second stable configuration. The electrical connection 490 may take the form of a first contact 492 and a second contact 494 separated from the first contact 492 by an air gap or an evacuated space. The shuttle 420 may be made of, coated with, or simply attached to an electrically conductive material capable of closing and completing the circuit. When the mechanism 410 is actuated, the shuttle 420 simultaneously engages the ends of the first and second electrical contacts 492, 494 to close the circuit. The circuit may then be opened again by actuating the mechanism 410 back to the first stable configuration.

Although FIGS. 1, 7, and 8 have shown embodiments in which comparatively rigid legs are connected by small length flexural pivots, other configurations may accomplish bistable operation without requiring rigid legs. For example, a single arched beam may perform the functions of the legs as well as the flexural pivots. Such a configuration will be shown and described in connection with FIG. 9.

Figure 9:
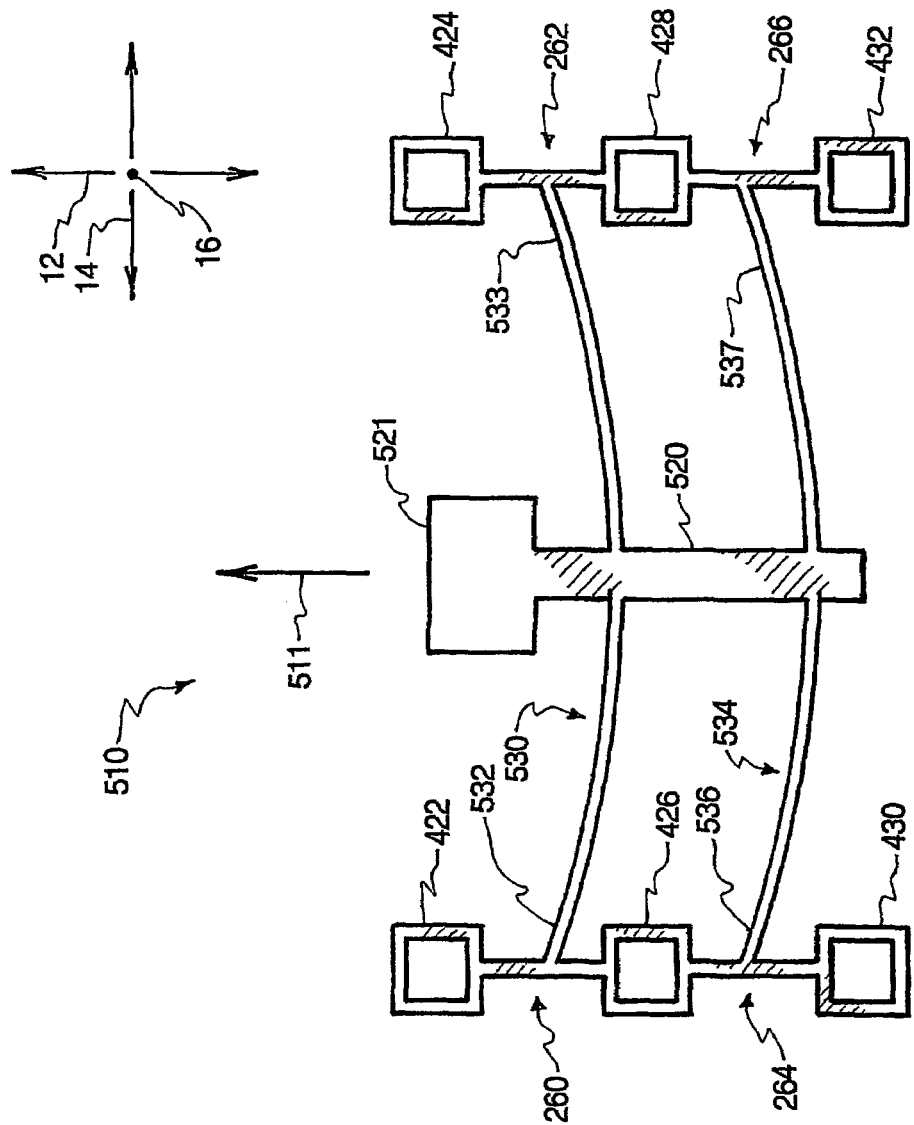
FIG. 9 is a plan view of yet another alternative embodiment of a compliant bistable mechanism according to the invention.

Referring to FIG. 9, another embodiment of a mechanism 510 according to the invention is depicted. The mechanism 510 may be bistable, and may be sized for MEMS applications. Furthermore, the mechanism 510, as shown, may be utilized as an accelerometer. The mechanism 510 may be designed to receive an input force 5ll, which may come from acceleration. The mechanism 510 may have a shuttle 520 configured to move in the longitudinal direction 12; the shuffle 520 may have a weight 521 affixed to or integrally formed with the shuttle 520.

The mechanism 510 may also have base members 422, 424, 426, 428,430, 432 and deformable mounts 260, 262, 264, 266 like those of FIG. 8. However, in place of the legs and flexural pivots of FIG. 8, the mechanism 510 of FIG. 9 may have a first arched beam 530 with a first end 532 attached to the first deformable mount 260 and a second end 533 attached to the second deformable mount 262, and a second arched beam 534 with a first end 536 attached to the third deformable mount 264 and a second end 537 attached to the fourth deformable mount 266. The arched beams 530, 534 may each have a substantially uniform cross section.

The configuration depicted in FIG. 9 may be the first stable configuration, and may also be the manufacturing configuration in which no significant deformation is present. The arched beams 530, 534 may be advantageous in that their structure is very simple, and no sharp discontinuities are present to cause stress concentrations. Furthermore, they are comparatively easy to manufacture. However, the arched beams 530, 534 may make the mechanism 510 somewhat more difficult to model due to their length and the irregularity of their deformation.

As the input force 511 is applied, the arched beams 530, 534 may be compressed into an "S" shape. When the shuttle 520 has passed the toggle point, the arched beams 530, 534 may move into a second stable configuration, in which the "S" shape is maintained by the inward pressure of the deformable mounts 260, 262, 264,266. In the embodiment of FIG. 9, the input force 511 may be applied by acceleration. More specifically, as the base members 422, 424, 426, 428, 430, 432 move in a direction opposite to that of the input force 511, inertia will act on the weight 521 to draw the shuttle 520 in the direction of the input force 511, with respect to the base members 422, 424,426, 428, 430, 432.

The mass of the weight 521 may be carefully selected so that the mechanism 510 snaps into the second stable configuration when the acceleration on the mechanism 510 reaches a certain threshold. For example, the mechanism 510 may be used to signal a vehicle impact for subsequent diagnosis, or to trigger safety features such as airbags in real time. The mechanism 510 may simply be combined with the electrical connection 490 of FIG. 8 to close a circuit upon detection of impact. Such a bistable accelerometer may be useful in many other applications as well. The mechanism 510 may even be reconfigured to provide more than two stable configurations, so that different configurations can be obtained from different accelerations.

Like the mechanisms 10, 410 of FIGS. 1 and 8, the mechanism 510 may also be described in terms of compliant bridges. More specifically, each of the arched beams 530, 534 operates in conjunction with the shuttle 520 to form a compliant bridge.

A bistable mechanism according to the invention may be triggered in a wide variety of ways besides acceleration. With reference to MEMS applications, a bistable mechanism may be triggered by mechanical linear or rotary devices, electrostatic actuators such as comb drives, or actuators driven by thermal expansion. Such actuation will be shown and described in greater detail in connection with FIG. 10.

Figure 10:
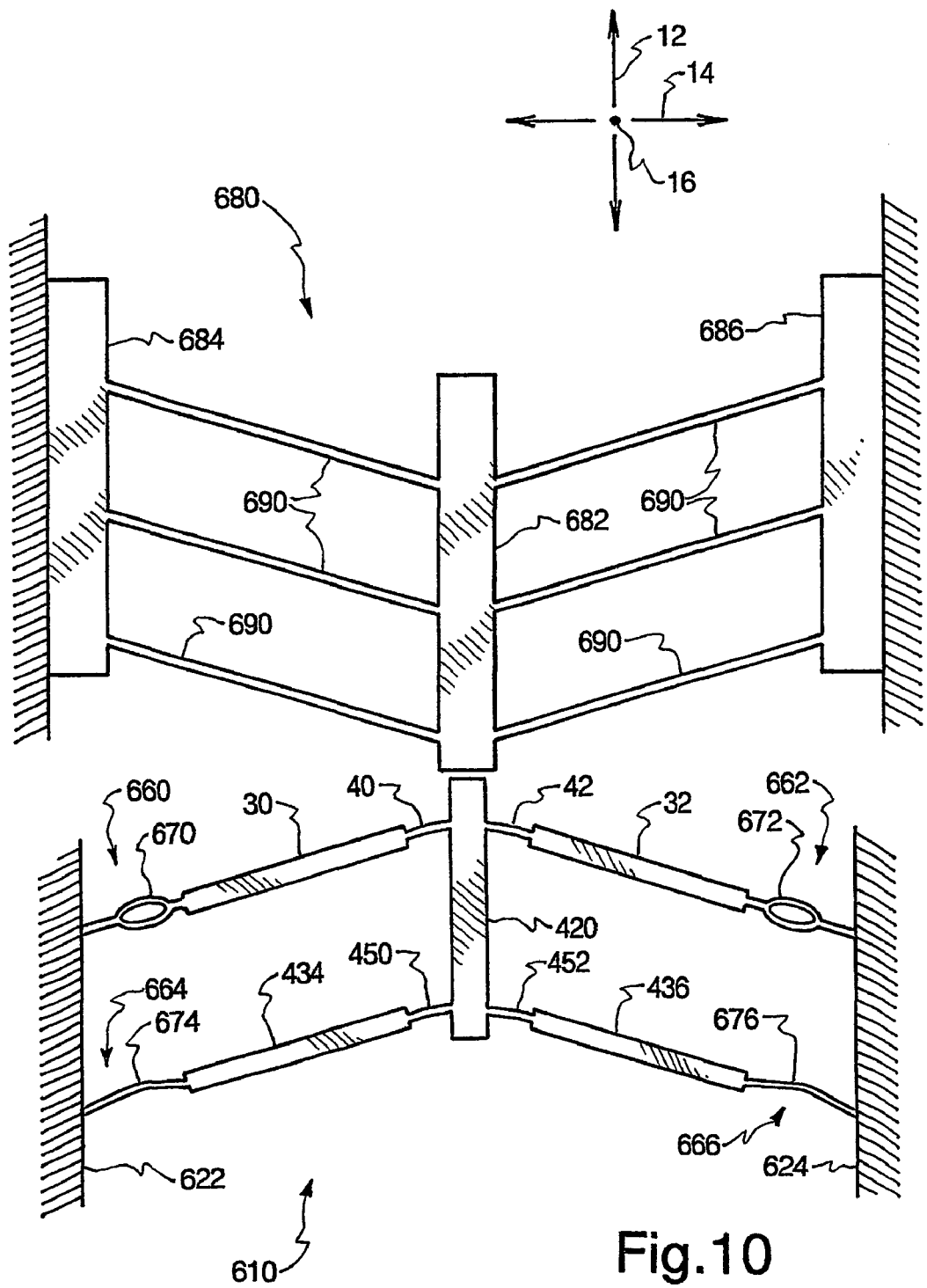
FIG. 10 is a plan view of still another alternative embodiment of a compliant bistable mechanism according to the invention.

Referring to FIG. 10, yet another alternative embodiment of a mechanism 610 with bistable MEMS application is shown. The mechanism 610 may be configured somewhat similar to the mechanism 410 of FIG. 8, with a shuttle 420 connected to first, second, third, and fourth legs 30, 32, 434, 436 by first, second, third, and fourth shuttle flexural pivots 40, 42, 450, 452, respectively. However, only two base members 622, 624 are present, and the deformable mounts 460, 462, 464, 466 of FIG. 8 have been replaced by first, second, third, and fourth deformable mounts 660, 662, 664, 666, which are provided as examples of alternative types of deformable mounts A "deformable mount" is not limited to the deformable mounts 60 62, 460, 462, 464, 466 depicted in FIGS. 1, 7, 8, and 9. Rather, any structure that is capable as being modeled or functioning as a spring can be used to create multiple low potential energy positions. While the embodiments of the previous figures utilize a fixed-fixed beam in each deformable mount, other types of deformable mounts may be implemented.

For example, the deformable mount may be a beam that cantilevers from a rigid surface at one end and is fixed to a small-length flexural pivot at the other end. The bending of the beam at the non-fixed end will provide the biasing force that creates the two low potential energy positions. Alternatively, the deformable mount may be a fixed-fixed arched beam or a beam that is initially deflected. In yet another variation of the bistable mechanism, the deformable mount may be a structure similar to the bistable mechanism itself, but with only one stable position; the deformable mount may simply resist any deflection from the one stable configuration to provide biasing force. One of ordinary skill in the art will recognize that there are many methods of creating a force to urge a compliant bridge into multiple low potential energy positions.

In the mechanism 610 of FIG. 10, the first deformable mount 660 has a first compressible member 670 that extends from the first base member 622 in cantilevered fashion to attach to the first leg 30. Similarly, the second deformable mount 662 has a second compressible member 672 that extends from the second base member 624 in cantilevered fashion to attach to the second leg 32. Each of the compressible members 670, 672 may take the form of a relatively thin beam with a looped portion; the looped portion may be compressed to provide the biasing force to store potential energy, thereby performing essentially the same function as the mounting beams 58, 59 of FIG. 1.

Similarly, the third and fourth deformable mounts 664, 666 may have third and fourth compressible members 674, 676, respectively. The third and fourth compressible members 674, 676 may extend from the first and second base members 622, 624 to attach to the third and fourth legs 434, 436, respectively. Each of the compressible members 674, 676 may take the form of a relatively thin beam with a bend or kink to ensure that the beam will buckle under compression. The compressible members 674, 676 may have such a shape that the buckling is elastic over the feasible range of travel of the shuttle 420.

The mechanism 610 may receive an input force from an actuator 680 disposed in close proximity to the mechanism 610. As mentioned previously, a wide variety of actuator types may be used, including micromechanical devices such as worm gears, rack and pinion assemblies and the like, electrostatic actuators such as comb drives, and thermal actuators. The exemplary actuator 680 of FIG. 10 is a thermal microactuator. The actuator 680 may have a shuttle 682 positioned close to the shuttle 420 of the mechanism 410 when the mechanism 410 is in the first stable configuration. The shuttle 682 of the actuator 680 may be coupled to a first base member 684 and a second base member 686 by a plurality of expansion members 690, each of which is comparatively long and thin.

When electric current passes from the first base member 684 to the second base member 686, the current travels through the expansion members 690. The expansion members 690 heat up in response to the current, and expand to press inward against the shuttle 682. The shuttle 682 is thereby driven to move toward the shuttle 420 of the mechanism 610. The shuttle 682 may contact the shuttle 420, and exert pressure on the shuttle 420 until the mechanism 610 has passed the toggle point.

After the mechanism 610 passes the toggle point, the potential energy stored by the mechanism 610, and more specifically, stored by the compressible members 670, 672, 674, 676, may act to move the mechanism 610 into the second stable configuration, thereby pulling the shuttle 420 out of contact with the shuttle 682. If desired, the shuttle 420 may be moved back to the first stable configuration through the use of a second actuator (not shown), or through the application of electrical or thermal energy directly to the mechanism 610.

In the alternative, the shuttle 682, and indeed, the entire actuator 680, may be integrally formed with the shuttle 420 of the mechanism 410. Thus, the actuator 680 may be used to push the mechanism 610 into the second stable configuration, and to pull the mechanism 610 back into the first stable configuration. Once the current is disconnected, the expansion members 690 will cool, thereby retracting the shuttle 682 to pull the shuttle 420 back into its original position.

According to another embodiment, a bistable mechanism may even incorporate the functionality of an actuator. For example, such a mechanism may have members that thermally expand under the application of electric current to push a shuttle into a second stable position. The shuttle may return to the first stable position after the current is disconnected. In the alternative, the shuttle may remain at the second stable position after the current is disconnected, but application of current elsewhere on the bistable mechanism may serve to return the shuttle to the first stable position.

The mechanisms disclosed herein may be modified in many other ways to suit a wide variety of applications. The invention may be embodied in other specific forms without departing from its structures, methods, or other essential characteristics as broadly described herein and claimed hereinafter. The described embodiments are to be considered in all respects only as illustrative, and not restrictive. The scope of intellectual property rights is, therefore, indicated by the appended claims, rather than by the foregoing description. All changes that come within the meaning and range of equivalency of the claims are to be embraced within their scope.

What is claimed is:

1. A method for determining a desired value of at least one geometric characteristic for a selected compliant structure configured to have at least one objective characteristic, the method comprising:

creating an analytical model of the selected compliant structure, the analytical model having a plurality of substantially rigid elements connected by at least one joint, the analytical model having at least one analytical model characteristic corresponding to the geometric characteristic;

applying a first recursive optimization algorithm to determine a first value of the analytical model characteristic; and deriving the desired value of the geometric characteristic from the analytical model characteristic.

2. The method of claim 1, wherein the selected compliant structure comprises a plurality of geometric characteristics, each of which has a corresponding analytical model characteristic.

3. The method of claim 1, further comprising determining at least one mathematical relationship between the analytical model characteristic and the objective characteristic.

4. The method of claim 3, wherein the first recursive optimization algorithm iteratively uses the mathematical relationship to determine a value of the objective characteristic for each of a plurality of values of the analytical model characteristic.

5. The method of claim 1, wherein the desired value of the geometric characteristic is derived from the first value of the analytical model characteristic.

6. The method of claim 1, wherein the first recursive optimization algorithm comprises simulated annealing.

7. The method of claim 1, further comprising applying a second recursive optimization algorithm to the first value to determine a second value of the analytical model characteristic.

8. The method of claim 7, wherein the desired value of the geometric characteristic is derived from the second value of the analytical model characteristic.

9. The method of claim 8, wherein the second recursive optimization algorithm comprises generalized reduced gradient.

10. The method of claim 9, wherein the first value is proximate a global optimum of the objective characteristic.

11. The method of claim 10, wherein the second value is within a threshold range of the global optimum of the objective characteristic.

12. The method of claim 1, wherein the analytical model further comprises at least one of the group consisting of linear springs and torsional springs.

13. The method of claim 1, wherein the selected compliant structure includes at least one semi-rigid link connected by at least one small-length flexural pivot.

14. The method of claim 13, wherein the geometric characteristics of the semi-rigid link and the small-length flexural pivot are selected from the group consisting of the width of the small-length flexural pivot, the out-of-plane thickness of the semi-rigid link, the out-of-plane thickness of the small-length flexural pivot, the modulus of elasticity of the compliant structure material, the length of the semi-rigid link, the length of the small-length flexural pivot, and the initial angle between the small-length flexural pivot and the semi-rigid link.

15. The method of claim 1, wherein the selected compliant structure comprises a compliant bistable mechanism.

16. The method of claim 1, wherein the selected compliant structure comprises a compliant micromechanism.

17. A method for determining desired values of a plurality of geometric characteristics for a selected compliant structure configured to have at least one objective characteristic, the method comprising:
 establishing initial geometric characteristics of the selected compliant structure, wherein the initial geometric characteristics define an interim configuration;
 applying a first recursive optimization algorithm wherein a random geometric characteristic of the interim configuration is changed and the randomly changed geometric characteristic is integrated into and redefines the interim configuration according to an objective comparison algorithm, wherein the first recursive optimization algorithm iterates until the interim configuration is proximate a global optimum;
 applying a second recursive optimization algorithm wherein a vector is created by adjusting geometric characteristics of the interim configuration such that the vector identifies a number of improved geometric characteristics, wherein the improved geometric characteristics are integrated into the interim configuration, the second recursive optimization algorithm iterating until the interim configuration is within a threshold range of the global optimum; and
 establishing the desired values of the geometric characteristics for the selected compliant structure from the geometric characteristics of the globally optimized interim configuration.

18. The method of claim 17, wherein the objective comparison algorithm comprises:

comparing the interim configuration, incorporating the randomly changed geometric configuration, to the objective characteristic; and
 performing one of the following:
  selecting a configuration that approaches the operational characteristic;
  rejecting a configuration that does not approach the operational characteristic; or
  selecting a configuration that does not approach the operational characteristic through the use of a stochastic method.

19. The method of claims 18, wherein the annealing algorithm is based upon a cooling schedule of a metal annealing process.

20. The method of claim 17, wherein the selected compliant structure is a bistable compliant mechanism.

21. The method of claim 20, wherein the first recursive optimization algorithm identifies at least one bistable state of the bistable compliant mechanism.

22. The method of claim 17, wherein the selected compliant structure is a compliant micromechanism.

23. The method of claim 17, wherein the initial geometric characteristics of the interim configuration are derived from a finite element analysis of the selected compliant structure.

24. The method of claim 17, wherein the first recursive optimization algorithm comprises a simulated annealing method.

25. The method of claim 17, wherein the second recursive optimization algorithm comprises a generalized reduced gradient method.

26. The method of claim 17, wherein at least one geometric characteristic of the selected compliant structure is held constant during the first recursive optimization algorithm.

27. The method of claim 17, wherein at least one geometric characteristic of the selected compliant structure is held constant during the second recursive optimization algorithm.

28. A method for determining desired values of a plurality of analytical characteristics for a selected compliant structure configured to have at least one objective characteristic, the method comprising:
 establishing initial analytical characteristics of the selected compliant structure, wherein the initial analytical characteristics define an interim configuration;
 applying a first recursive optimization algorithm wherein a random analytical characteristic of the interim configuration is changed and the randomly changed analytical characteristic is integrated into and redefines the interim configuration according to an objective comparison algorithm, wherein the first recursive optimization algorithm iterates until the interim configuration is proximate a global optimum;
 applying a second recursive optimization algorithm wherein a vector is created by adjusting analytical characteristics of the interim configuration such that the vector identifies a number of improved analytical characteristics, wherein the improved analytical characteristics are integrated into and redefine the interim configuration, the second recursive optimization algorithm iterating until the interim configuration is within a threshold range of the global optimum; and
 establishing the desired values of the analytical characteristics for the selected compliant structure from the analytical characteristics of the globally optimized interim configuration.

29. A method for determining desired values of a plurality of analytical characteristics for a selected compliant structure configured to have at least one objective characteristic, the method comprising:

determining a desired objective characteristic to be obtained for the selected compliant structure;

creating an analytical model of the selected compliant structure, the analytical model having a plurality of substantially rigid elements connected by at least one joint, the analytical model having a plurality of analytical model characteristics corresponding to the analytical model, wherein the analytical model characteristics define an interim configuration;

applying a first recursive optimization algorithm wherein a random analytical model characteristic of the interim configuration is changed and the randomly changed analytical model characteristic is integrated into and redefines the interim configuration according to an objective comparison algorithm, wherein the first recursive optimization algorithm iterates until the interim configuration is proximate a global optimum;

applying a second recursive optimization algorithm wherein a vector is created by adjusting the analytical model characteristics of the interim configuration such that the vector identifies a number of improved analytical model characteristics, wherein the improved analytical model characteristics are integrated into and redefine the interim configuration, the second recursive optimization algorithm iterating until the interim configuration is within a threshold range of the global optimum;

determining the desired values of the analytical characteristics that correspond to the values of the analytical model characteristics.

30. A micromechanism having a first stable configuration and a second stable configuration, the micromechanism comprising:

a first base member;

a first beam section coupled to the first base member;

a solid and rigid shuttle integrally formed with the base member such that the shuttle is translatable between a first low potential energy position corresponding to the first stable configuration and a second low potential energy position corresponding to the second stable configuration, wherein the shuttle is sized for use in microelectromechanical systems; and a flexural pivot connecting the shuttle to the first beam section, wherein the flexural pivot has a thinner cross-section than the first beam section.

31. The micromechanism of claim 30 further comprising:

a second base member; and a second beam section coupled to the second base member, wherein the first and second beam sections are disposed on either side of the shuttle such that the first beam section, the rigid shuttle, and the second beam section form a compliant bridge, the shuttle forming a central portion of the compliant bridge.

32. The micromechanism of claim 31 wherein the shuttle extends substantially perpendicular to the first and second beam sections to receive an input force.

33. The micromechanism of claim 30 wherein the mass of the shuttle is selected to move the micromechanism between the first and second stable configurations at a predetermined acceleration.

34. The micromechanism of claim 30 wherein the shuttle is positioned to close an electrical circuit in only one of the first position and the second position.

35. The micromechanism of claim 30 wherein the shuttle is positioned to selectively abut an actuator to receive an input force from the actuator.

36. The micromechanism of claim 30 wherein the shuttle is attached to an actuator to receive an input force from the actuator.

37. The micromechanism of claim 30 wherein the micromechanism is positioned to be toggled between low potential energy positions by a thermal microactuator.

38. The micromechanism of claim 30 wherein the micromechanism is positioned to be toggled between low potential energy positions by an electrostatic actuator.

39. A micromechanism having a first stable configuration and a second stable configuration, the micromechanism comprising:

a solid and rigid shuttle sized for use in microelectromechanical systems, wherein the shuttle is translatable between a first low potential energy position corresponding to the first stable configuration and a second low potential energy position corresponding to the second stable configuration;

a first leg coupled to the shuttle; and a first deformable mount coupled to the first leg such that the shuttle, the first leg, and the first deformable mount are integrally formed, the first deformable mount having a plurality of deformed configurations in which the shuttle is disposed between the first and second positions such that the first deformable mount urges the shuttle toward one of the first position and the second position, the first deformable mount further having an undeformed configuration.

40. The micromechanism of claim 39 wherein the first deformable mount comprises a mounting beam fixed between two anchors.

41. The micromechanism of claim 39 wherein the first deformable mount comprises a mounting beam cantilevered from a single anchor.

42. The micromechanism of claim 39 wherein the first deformable mount comprises a mounting beam with an arch shape in the undeformed configuration.

43. The micromechanism of claim 39 wherein the first deformable mount is disposed in one of the deformed configurations in at least one of the first stable configuration and the second stable configuration.

44. The micromechanism of claim 39 wherein the first deformable mount comprises a member directly coupled to the first leg, wherein the member is configured to provide resilient force in proportion to deflection of the member.

45. The micromechanism of claim 39 wherein the first leg is arched.

46. The micromechanism of claim 39 further comprising:

a second leg coupled to the shuttle; and a second deformable mount coupled to the second leg, wherein the second leg and second deformable mount are integrally formed with the shuttle.

47. The micromechanism of claim 46 further comprising:

a third leg coupled to the first deformable mount and the shuttle; and a fourth leg coupled to the second deformable mount and the shuttle;

a second leg coupled to the second deformable mount, wherein the first and second legs are disposed on either side of the shuttle such that the first leg, the second leg, and the shuttle form a compliant bridge, the shuttle forming a central portion of the compliant bridge.

48. The micromechanism of claim 39 further comprising a third leg coupled to the shuttle and the first deformable mount.

49. The micromechanism of claim 39 further comprising a third leg coupled to a second deformable mount, wherein the first and second deformable mounts are aligned in series and bound at the ends by anchors.

50. The micromechanism of claim 39 wherein the first leg comprises a plurality of sections coupled to move relative to each other.

51. A micromechanism having a first stable configuration and a second stable configuration, the micromechanism comprising:
   a solid and rigid shuttle with a first low potential energy position corresponding to the first stable configuration and a second low potential energy position corresponding to the second stable configuration;
   a first leg;
   a first shuttle pivot coupling disposed between the shuttle and the leg;
   a first base member; and
   a first base pivot coupling disposed between the leg and the base member;
   wherein the shuttle, the first leg, the first shuttle pivot coupling, the first base member, and the first base pivot coupling are all integrally formed with each other, and wherein at least one of the first shuttle pivot coupling and the first base pivot coupling has a longitudinal length different from a longitudinal length of the first leg.

52. The micromechanism of claim 51 wherein the shuttle pivot coupling comprises a small-length flexural pivot integrally formed with the shuttle and the first leg.

53. The micromechanism of claim 51 wherein the shuttle pivot coupling comprises a pin joint.

54. The micromechanism of claim 51 wherein the base pivot coupling comprises a small-length flexural pivot integrally formed with the first base member and the first leg.

55. The micromechanism of claim 51 wherein the base pivot coupling comprises a pin joint.

56. The micromechanism of claim 51 further comprising:
   a second leg;
   a second shuttle pivot coupling disposed between the shuttle and the second leg;
   a second base member; and
   a second base pivot coupling disposed between the second leg and the second base member.

57. The micromechanism of claim 51 wherein the base member is a deformable mount.

58. A micromechanism having a first stable configuration and a second stable configuration, the micromechanism comprising:
   a first base member;
   a second base member separated from the first base member by an offset distance; and
   a compliant bridge coupled to and integrally formed with the first and second base members, wherein the compliant bridge has a nonuniform longitudinal length and is disposable along a first path corresponding to the first stable configuration and a second path corresponding to the second stable configuration, wherein each of the first and second paths is longer than the offset distance, wherein the compliant bridge comprises a solid and rigid shuttle.

59. The micromechanism of claim 58 wherein the compliant bridge comprises an arched beam with a first end pivotally coupled to the first base member and a second end pivotally coupled to the second base member.

60. The micromechanism of claim 58 further comprising:
   a first mounting beam cantilevered to the first base member to form a first deformable mount; and
   a second mounting beam cantilevered to the second base member to form a second deformable mount.

61. The micromechanism of claim 58 wherein the compliant bridge comprises a beam having a first beam section coupled to the first base member, a second beam section coupled to the second base member, and wherein the shuttle is disposed between the first and second beam sections to from a central portion of the beam.

62. The micromechanism of claim 58 wherein the shuttle extends substantially perpendicular to the first path.

63. The micromechanism of claim 58 wherein the compliant bridge comprises:
   a first leg coupled to the first base member;
   a second leg coupled to the second base member; and
   the shuttle is coupled between the first and second legs.

64. The micromechanism of claim 58 wherein the micromechanism toggles between stable configurations when an electrical current passes through and elongates the compliant bridge.

65. A micromechanism having a first stable configuration and a second stable configuration, wherein the micromechanism is a bistable accelerometer, the micromechanism comprising:
   an electrical connection;
   a first base member;
   a shuttle integrally formed with the base member such that the shuttle is translatable between a first low potential energy position corresponding to the first stable configuration and a second low potential energy position corresponding to the second stable configuration, wherein the shuttle contacts the electrical connection in the second stable configuration to close a circuit, wherein the mass of the shuttle is selected to move the micromechanism between the first and second stable configurations at a predetermined acceleration.

66. The micromechanism of claim 65 further comprising a first beam section coupled to the first base member and a flexural pivot connecting the shuttle to the first beam section, wherein the flexural pivot has a thinner cross-section than the first beam section.

67. The micromechanism of claim 65 further comprising:
   a second base member;
   a first beam section coupled to the first base member; and
   a second beam section coupled to the second base member, wherein the first and second beam sections are disposed on either side of the shuttle such that the first beam section, the shuttle, and the second beam section form a compliant bridge, the shuttle forming a central portion of the compliant bridge.

* * * * *

UNITED STATES PATENT AND TRADEMARK OFFICE
CERTIFICATE OF CORRECTION

PATENT NO. : 7,075,209 B2 Page 1 of 1
APPLICATION NO. : 10/333302
DATED : July 11, 2006
INVENTOR(S) : Larry Howell et al.

It is certified that error appears in the above-identified patent and that said Letters Patent is hereby corrected as shown below:

At col. 1, line 3, please insert:

--This invention was made with government support under contract number CMS-9978737 and contract number DMI – 9624574 awarded by the National Science Foundation (NSF). The government has certain rights in the invention.--.

Signed and Sealed this

Thirteenth Day of October, 2009

David J. Kappos
*Director of the United States Patent and Trademark Office*